US008705278B2

(12) United States Patent
Lue

(10) Patent No.: US 8,705,278 B2
(45) Date of Patent: Apr. 22, 2014

(54) ONE-TRANSISTOR CELL SEMICONDUCTOR ON INSULATOR RANDOM ACCESS MEMORY

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/940,961

(22) Filed: Nov. 5, 2010

(65) Prior Publication Data

US 2011/0095353 A1 Apr. 28, 2011

Related U.S. Application Data

(63) Continuation of application No. 12/099,910, filed on Apr. 9, 2008, now Pat. No. 7,848,148.

(60) Provisional application No. 60/980,795, filed on Oct. 18, 2007, provisional application No. 61/019,383, filed on Jan. 7, 2008.

(51) Int. Cl.
*G11C 16/04* (2006.01)

(52) U.S. Cl.
USPC ............ 365/185.06; 365/185.08; 365/185.17; 365/185.28; 365/184; 257/324

(58) Field of Classification Search
USPC ............. 365/185.18, 185.06, 185.08, 185.17, 365/185.28, 184
See application file for complete search history.

(56) References Cited

U.S. PATENT DOCUMENTS

| | | | |
|---|---|---|---|
| RE31,083 E | 11/1982 | DeKeersmaecker et al. | |
| 4,630,086 A | 12/1986 | Sato et al. | |
| 4,888,630 A * | 12/1989 | Paterson | 365/185.24 |
| 5,286,994 A | 2/1994 | Ozawa et al. | |
| 5,319,229 A | 6/1994 | Shimoji et al. | |
| 5,414,861 A * | 5/1995 | Horning | 365/229 |
| 5,511,020 A * | 4/1996 | Hu et al. | 365/185.28 |
| 5,515,319 A * | 5/1996 | Smayling et al. | 365/185.27 |
| 5,590,073 A * | 12/1996 | Arakawa et al. | 365/185.08 |
| 5,633,178 A * | 5/1997 | Kalnitsky | 438/288 |
| 5,691,560 A * | 11/1997 | Sakakibara | 257/316 |

(Continued)

FOREIGN PATENT DOCUMENTS

| | | |
|---|---|---|
| EP | 0016246 | 10/1980 |
| EP | 1411555 A2 | 4/2004 |

(Continued)

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

(Continued)

*Primary Examiner* — Hoai V Ho
*Assistant Examiner* — Jay Radke
(74) *Attorney, Agent, or Firm* — Kenta Suzue; Haynes Beffel & Wolfeld LLP

(57) ABSTRACT

Silicon-oxide-nitride-oxide-silicon SONOS-type devices (or BE-SONOS) fabricated in Silicon-On-Insulator (SOI) technology for nonvolatile implementations. An ultra-thin tunnel oxide can be implemented providing for very fast program/erase operations, supported by refresh operations as used in classical DRAM technology. The memory arrays are arranged in divided bit line architectures. A gate injection, DRAM cell is described with no tunnel oxide.

6 Claims, 24 Drawing Sheets

(56) References Cited

U.S. PATENT DOCUMENTS

| | | | |
|---|---|---|---|
| 5,880,991 A * | 3/1999 | Hsu et al. | 365/182 |
| 5,952,692 A | 9/1999 | Nakazato et al. | |
| 6,011,725 A | 1/2000 | Eitan | |
| 6,026,026 A | 2/2000 | Chan et al. | |
| 6,072,722 A | 6/2000 | Hirano | |
| 6,074,917 A | 6/2000 | Chang et al. | |
| 6,169,693 B1 | 1/2001 | Chan et al. | |
| 6,218,700 B1 | 4/2001 | Papadas | |
| 6,301,155 B1 * | 10/2001 | Fujiwara | 365/185.18 |
| 6,469,343 B1 | 10/2002 | Miura et al. | |
| 6,512,274 B1 | 1/2003 | King et al. | |
| 6,512,696 B1 | 1/2003 | Fan et al. | |
| 6,605,840 B1 | 8/2003 | Wu | |
| 6,709,928 B1 | 3/2004 | Jenne et al. | |
| 6,720,630 B2 | 4/2004 | Mandelman et al. | |
| 6,740,928 B2 | 5/2004 | Yoshii et al. | |
| 6,784,480 B2 | 8/2004 | Bhattacharyya | |
| 6,815,764 B2 | 11/2004 | Bae et al. | |
| 6,818,558 B1 | 11/2004 | Rathor et al. | |
| 6,858,906 B2 | 2/2005 | Lee et al. | |
| 6,897,533 B1 | 5/2005 | Yang et al. | |
| 6,912,163 B2 | 6/2005 | Zheng et al. | |
| 6,977,201 B2 | 12/2005 | Jung et al. | |
| 7,054,201 B2 | 5/2006 | Ahn et al. | |
| 7,075,828 B2 | 7/2006 | Lue et al. | |
| 7,115,469 B1 | 10/2006 | Halliyal et al. | |
| 7,115,942 B2 | 10/2006 | Wang | |
| 7,133,313 B2 | 11/2006 | Shih et al. | |
| 7,187,590 B2 | 3/2007 | Zous et al. | |
| 7,187,594 B2 | 3/2007 | Shibata et al. | |
| 7,315,474 B2 | 1/2008 | Lue et al. | |
| 2001/0002884 A1 * | 6/2001 | Hiraki et al. | 365/185.09 |
| 2002/0000592 A1 * | 1/2002 | Fujiwara | 257/296 |
| 2002/0114193 A1 * | 8/2002 | Pio | 365/185.29 |
| 2002/0195646 A1 * | 12/2002 | Tseng | 257/315 |
| 2003/0030100 A1 | 2/2003 | Lee et al. | |
| 2003/0032242 A1 | 2/2003 | Lee et al. | |
| 2003/0042534 A1 | 3/2003 | Bhattacharyya | |
| 2003/0183873 A1 * | 10/2003 | Fujiwara | 257/315 |
| 2003/0224564 A1 | 12/2003 | Kang et al. | |
| 2004/0079983 A1 | 4/2004 | Chae et al. | |
| 2004/0156240 A1 * | 8/2004 | Fujiwara | 365/185.24 |
| 2004/0251489 A1 | 12/2004 | Jeon et al. | |
| 2004/0256679 A1 | 12/2004 | Hu | |
| 2005/0006696 A1 | 1/2005 | Noguchi et al. | |
| 2005/0023603 A1 | 2/2005 | Eldridge et al. | |
| 2005/0062098 A1 | 3/2005 | Mahajani et al. | |
| 2005/0093054 A1 | 5/2005 | Jung | |
| 2005/0135155 A1 | 6/2005 | Ishimaru et al. | |
| 2005/0194633 A1 * | 9/2005 | Mori | 257/324 |
| 2005/0219906 A1 | 10/2005 | Wu | |
| 2005/0237801 A1 | 10/2005 | Shih | |
| 2005/0237809 A1 | 10/2005 | Shih et al. | |
| 2005/0237813 A1 | 10/2005 | Zous et al. | |
| 2005/0237815 A1 | 10/2005 | Lue et al. | |
| 2005/0237816 A1 | 10/2005 | Lue et al. | |
| 2005/0243594 A1 * | 11/2005 | Sander et al. | 365/145 |
| 2005/0270849 A1 | 12/2005 | Lue | |
| 2005/0281085 A1 | 12/2005 | Wu | |
| 2006/0018164 A1 * | 1/2006 | Wu | 365/185.29 |
| 2006/0118858 A1 | 6/2006 | Jeon et al. | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202261 A1 * | 9/2006 | Lue et al. | 257/324 |
| 2006/0258090 A1 | 11/2006 | Bhattacharyya et al. | |
| 2006/0261401 A1 | 11/2006 | Bhattacharyya | |
| 2006/0279991 A1 * | 12/2006 | Park et al. | 365/185.17 |
| 2006/0279997 A1 | 12/2006 | Hsu et al. | |
| 2006/0281260 A1 | 12/2006 | Lue | |
| 2006/0291282 A1 * | 12/2006 | Liu et al. | 365/185.05 |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0045718 A1 | 3/2007 | Bhattacharyya | |
| 2007/0069283 A1 | 3/2007 | Shih et al. | |
| 2007/0120179 A1 | 5/2007 | Park et al. | |
| 2007/0134876 A1 | 6/2007 | Lai et al. | |
| 2007/0138539 A1 | 6/2007 | Wu et al. | |
| 2007/0290273 A1 | 12/2007 | Lue et al. | |
| 2008/0048241 A1 * | 2/2008 | Fujiwara et al. | 257/315 |
| 2008/0099830 A1 | 5/2008 | Lue et al. | |
| 2008/0116506 A1 | 5/2008 | Lue | |
| 2008/0135902 A1 * | 6/2008 | Sinha et al. | 257/296 |
| 2009/0039417 A1 | 2/2009 | Chen et al. | |

FOREIGN PATENT DOCUMENTS

| | | |
|---|---|---|
| EP | 01677311 A1 | 7/2006 |
| EP | 01677312 A1 | 7/2006 |
| JP | 11040682 A | 2/1999 |
| JP | 2004363329 A | 12/2004 |

OTHER PUBLICATIONS

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chindalore, et al., "A New Combination-Erase Technique for Erasing Nitride Based (SONOS) Nonvolatile Memories," IEEE Electron Dev. Lett. 24(4) Apr. 2003, 257-259.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

DiMaria, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications." 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile

(56) References Cited

OTHER PUBLICATIONS

Memory Devices," Int'l Symp on VLSI Technology, Systems and Applications, Apr. 23-25, 2007, pp. 1-2.

Lee, Chang, et al., "A Novel SONOS Structure of SiO2/SiN/Al2O3 with TaN Metal Gate for Multi-Giga Bit Flash Memories," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6.4.

Likharev, "Layered Tunnel Barriers for Nonvolatile Memory Devices," Appl. Phys. Lett. 73(15) Oct. 1998 2137-2139.

Lue et al., "A Novel P-Channel NAND-Type Flash memory 2-bit/cell Operation and High Programming Throughput (>20 MB/sec)," IEEE 2005, 4 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "BE-SONOS: A Bangap Engineered SONOS with Excellent Performance and Retention Time," IEDM Tech. Digest Dec. 2005 547-550.

Minami, et al., "New Scaling Guidelines for MNOS Nonvolatile Memory Devices," IEEE Trans on Electron Devices 38 (11) Nov 19912519-2526.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Search Report mailed May 9, 2008 in European Application No. 06000064.3 filed on Jan. 3, 2006, 3 pages.

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 7 pages.

Search Report mailed Feb. 14, 2007 in European Application No. 06000093.2 (Pub. No. EP-01677312) filed on Jan. 3, 2006, 7 pages.

Search report mailed Nov. 14, 2007 in European Application No. 06000064.3 (Pub. No. EP-01677312) filed on Jan. 3, 2006, 4 pages.

Search report mailed Nov. 14, 2007 in European Application No. 06000093.2 (Pub. No. EP-01677312) filed on Jan. 3, 2006, 4 pages.

Shih et al., "A Novel 2-bit/cell Nitride Storage Flash Memory with Greater than 1M P/E-cycle Endurance," IEEE IEDM 2004 881-884 (36.3.1-36.3.4).

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4.

Tsai et al., "Novel SONOS-Type Nonvolatile Memory Device with Suitable Band Offset in HfAlO Charge-Trapping Layer," Int'l Symp. on VLSI Tech, Systems and Applications Apr. 23-25, 2007, 2 pages.

Walker et al., "3D TFT-SONOS Memory Cell for Ultra-High Density File Storage Applications," 2003 Symposium on VLSI Tech Digest of Technical Papers, 29-30.

Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.

White et al., "On the Go with SONOS" IEEE Circuits and Devicces, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada et al., "A self-convergence erasing scheme for a simple stacked gate flash EEPROM," Proc. Int'l. Electron Devices Meeting, Dec. 1991 307-310.

Yeh, C.C., et al., "PHINES: A Novel Low Power Program/Erase, Small Pitch 2-Bit per Cell Flash Memory," IEDM Tech. Dig. 2002, 931-934.

* cited by examiner

ONE-TRANSISTOR CELL SEMICONDUCTOR ON INSULATOR RANDOM ACCESS MEMORY

This application is a continuation of co-pending U.S. patent application Ser. No. 12/099,910 filed on 9 Apr. 2008, which claims the benefit of U.S. Provisional Application No. 61/019,383, filed 7 Jan. 2008; and of U.S. Provisional Application No. 60/980,795, filed 18 Oct. 2007.

BACKGROUND OF THE INVENTION

1. Field of the Invention

The present invention relates to dielectric charge trapping memory technology arranged for nonvolatile and dynamic random access applications.

2. Description of Related Art

Current flash memory products are typically implemented using a NOR architecture or a NAND architecture.

For NOR architecture flash, the memory transistors are connected in parallel, so that large reading current can be provided (typically larger than 20 µA). The large reading current provides fast random access read applications (typically 70-100 nsec for single bit reading). However, for NOR Flash, programming usually employs channel hot electron (CHE) injection. CHE programming consumes relatively large amounts of power, limiting the total programming throughput for NOR Flash. Moreover, hot-carrier injection often has relatively poor program and erase P/E endurance, since the high-energy carriers easily damage the tunnel oxide.

For NAND Flash, the memory transistors are connected in series. Typically a total of 16 or 32 transistors are connected in series, and the reading current must flow through all the series connected cells, greatly reducing the reading current. Typically the read current in such devices is smaller than 1 µA, and the random access read time for single bit is about 20 µsec. Therefore, NAND Flash has the drawback that random access read is impractical. On the other hand, NAND Flash can utilize +/−Fowler-Nordheim (FN) tunneling for the erase and program operations. FN tunneling operation has very low power consumption, which facilitates high-speed and low-power applications. Also, devices using FN tunneling operation generally have much better P/E endurance.

However, NOR and NAND Flash do not support random bit-by-bit erase operations. For flash operations, a sector or page must be erased simultaneously. Therefore, Flash memory has not been applied for applications requiring random read and write operation at high speeds.

So-called AND Flash architectures have also been developed for random access applications, using silicon on insulator SOI structures or "assist gate" structures to provide independent source and drain lines for each column of cells. See, U.S. Patent Application Publication No. 2007/0057307, by Shum et al., published 15 Mar. 2007; and Hitoshi et al., "A 140 mm$^2$ 64 Mb AND Flash Memory with 0.4 mm Technology", 1996 IEEE International Solid-State Circuits Conference, pp. 34-36 (1996). However, slow erase speeds still limit application of AND architecture devices to applications that do not require high speed, random write access.

Dynamic random access memory DRAM is another class of memory device. The scaling of the conventional one-transistor, one capacitor 1T1C DRAM memory has become very difficult since the cell capacitance is not scalable. In recent years many one transistor 1T DRAM cells have been proposed. One attractive device is the floating body cell (FBC) described by Y. Minami, et al, in IEDM Tech. Dig., 2005, pp. 317-320, that utilizes the transient charge storage in the floating body of an SOI MOSFET. However, it is very difficult for an FBC to achieve good data retention because junction leakage easily bleeds the storage node. Moreover, large channel current (>50 µA) and thus high power is needed to generate impact ionization to program the cell.

Charge-trapping devices such as SONOS with ultra-thin (~1 nm) bottom tunnel oxide described by C. H. J. Wann, et al, in IEDM Tech. Dig., 1995, pp. 867-870, have also been proposed for DRAM. Direct tunneling through thin oxide provides fast program/erase speed at low voltage. However, during program/erase operation current flows through the gate oxide (tunnel oxide) and causes damage to the gate oxide. Therefore, SONOS devices have relatively poor endurance of <10$^7$ cycles.

It is desirable to provide an integrated circuit memory device that supports high density arrays, along with high-speed random access suitable for nonvolatile memory and for DRAM applications.

SUMMARY OF THE INVENTION

The present invention provides a memory structure solving fundamental problems associated with prior art flash memory technologies. Unlike NAND Flash, the memory cells in the arrays described herein are connected in parallel so that fast read operations may be provided. Unlike NOR Flash, low-power FN operation can be provided. Moreover, random erase for single cells is possible. Therefore, this memory offers random access program, erase and read functions.

The memory cells can be characterized as silicon-oxide-nitride-oxide-silicon SONOS-type devices (or BE-SONOS) fabricated in Silicon-On-Insulator (SOI) technology. The memory arrays are arranged in divided bit line architectures.

In alternative embodiments, an ultra-thin tunnel oxide is implemented providing for very fast program/erase operations, supported by refresh operations as used in classical DRAM technology.

In other alternative embodiments, no tunnel oxide is implemented providing for very fast program/erase operations so that the charge trapping layer is in contact with the gate for gate injection operation, or the channel for channel injection, and the charge trapping is supported by refresh operations as used in classical DRAM technology. The gate injection embodiment allows operation in modes avoiding tunneling damage to the oxide contacting the channel. The memory cells in the arrays described herein comprise a single transistor, so the scaling capability should be superior to the current DRAM technology, where a larger-area capacitor is required. For the DRAM embodiments, a "SONS" structure is described using use gate-injection to program and erase the memory cell. Without any "tunnel oxide" (relative to the gate) high program/erase speeds are achieved. By avoiding passing current through the gate oxide, very high endurance (>10G times) is achieved. Even without the top oxide, the silicon nitride trapping provides sufficient data retention for DRAM. Silicon rich nitride is utilized in embodiments described herein for improved performance. Also, p-channel implementations are described.

An integrated circuit is described therefore including a substrate which comprises a memory array on a first region of the substrate comprising one-transistor, and dielectric charge trapping memory cells arranged in a divided bit line architecture. Control circuitry is included in a second region of the substrate and coupled to the memory array. The control circuitry includes logic and bias circuitry having random access read, erase and program modes. In an erase mode, a selected cell is biased to cause hole tunneling to set an erase threshold state for the cell. In the program mode, a selected cell is biased to cause electron tunneling to set a program threshold state for the cell. For dynamic random access applications, a refresh mode is also supported by the control circuitry on the integrated circuit. In embodiments described herein, an array adapted for dynamic random access and an array adapted for nonvolatile storage are implemented on a single integrated circuit.

As described in more detail below, the first region of the substrate within which the memory array is implemented includes an insulator layer as is common in SOI structures. The memory array comprises a plurality of pairs of semiconductor source/drain lines on insulator layer. Each pair of semiconductor source/drain lines is separated by a semiconductor body line having an opposite conductivity type, and connected or otherwise coupled to the source line so that it is operated in the same or a similar bias condition as the source line. A plurality of word lines overlie the plurality of pairs of source/drain lines. An array of dielectric charge trapping structures between the word lines and the semiconductor bodies form memory cells. The memory cells are connected in parallel between the first and second lines of the corresponding pairs of semiconductor source/drain lines. In a nonvolatile embodiment, the tunneling layer of the charge trapping structure is adapted to prevent charge leakage such as using a bandgap engineered tunneling layer. In a dynamic random access embodiment, the tunneling layer of the charge trapping structure may be a very thin layer, or removed, allowing high-speed erase and program operations supported by a refresh operation to address charge leakage through the ultrathin tunneling layer.

Control circuitry is described for applying biasing arrangements for a program mode includes for n-channel memory cells using channel injection, applying a positive word line program voltage to a selected word line coupled to the selected cell, and a negative bit line program voltage to a selected bit line coupled to the selected cell. The positive word line program voltage as a magnitude, such as one half of the program voltage, that does not cause disturbance of memory states in other memory cells coupled to the selected word line. Likewise, the negative bit line program voltage has a magnitude, such as one half of the program voltage, that does not cause disturbance of memory states in other memory cells coupled to the selected bit line. Also, control circuitry is described for applying biasing arrangements for an erase mode that includes applying a negative word line erase voltage to a selected word line coupled to the selected cell, and a positive bit line erase voltage to a selected bit line coupled to the selected cell. The magnitudes of the negative word line erase voltage and positive bit line erase voltage are such that they do not cause disturbance of memory states in other memory cells.

Both p-channel and n-channel embodiments are described. Also, the technology described herein is adaptable for both gate injection and channel injection tunneling operations.

Furthermore, the memory cells are adapted for program and erase operations which can be executed in cycles suitable for dynamic random access modes, enabling application of the memory structures described herein and a wide variety of high-speed, random access applications not possible with SONOS type memory cells of the prior art.

Other aspects and advantages of the present invention can be seen on review of the drawings, the detailed description and the claims, which follow.

BRIEF DESCRIPTION OF THE DRAWINGS

FIG. 15a is for n-channel devices, and FIG. 15b is for p-channel devices.

DETAILED DESCRIPTION

A detailed description of embodiments of the present invention is provided with reference to the FIGS. 1-23.

Figure 1:
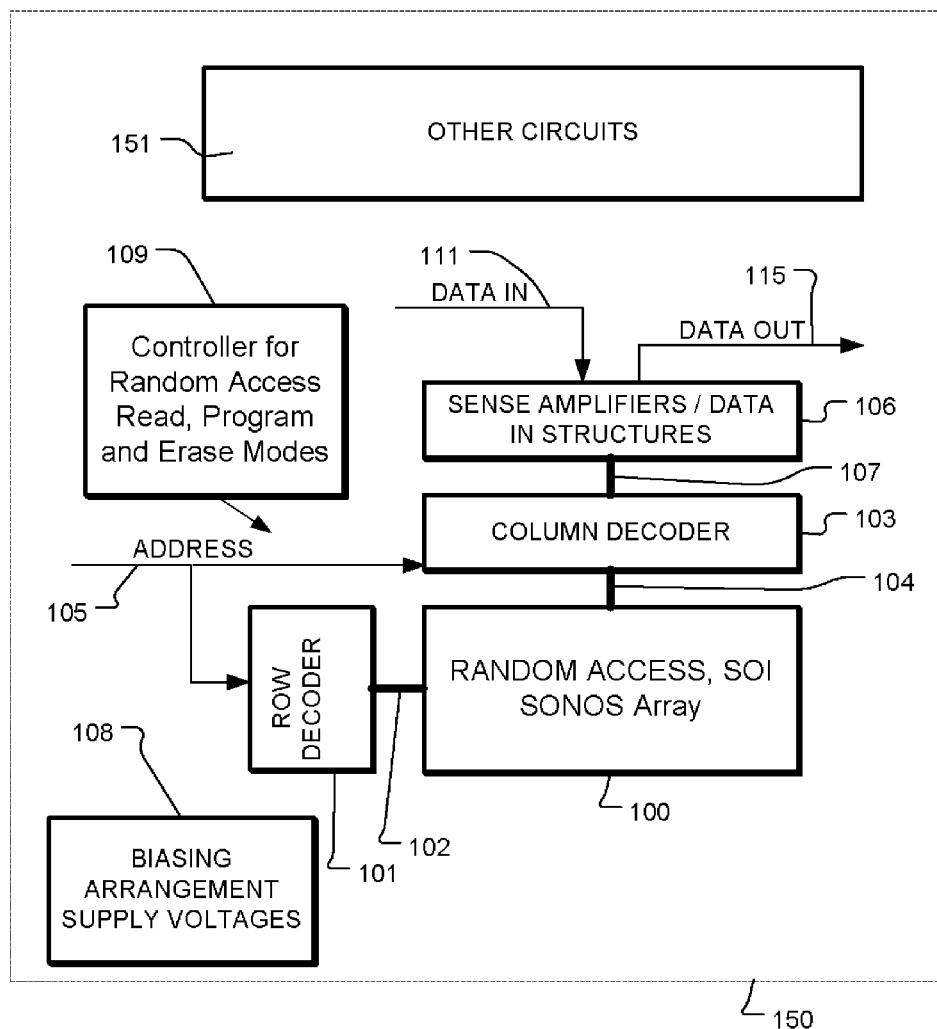
FIG. 1 is a simplified block diagram of an integrated circuit including a memory array which comprises one-transistor, dielectric charge trapping memory cells arranged in a divided bit line architecture in a SOI configuration, and adapted for random access read, erase and program operations.

FIG. 1 is a simplified block diagram of an integrated circuit 150 including a substrate which may be a single chip or multiple chips adapted for packaging together in a single integrated circuit package, and a memory array 100 in a first region of substrate which comprises an array of one-transistor, dielectric charge trapping memory cells arranged in a divided bit line architecture in a SOI configuration, and adapted for random access read, erase and program operations. A word line (or row) and block select decoder 101 is coupled to, and in electrical communication with, a plurality 102 of word lines and block select lines, and arranged along rows in the memory array 100. A bit line (column) decoder and drivers 103 are coupled to and in electrical communication with a plurality of bit lines 104 arranged along columns in the memory array 100 for reading data from, and writing data to, the memory cells in the memory array 100. Addresses are supplied on bus 105 to the word line decoder and drivers 101 and to the bit line decoder 103. Sense amplifiers and data-in structures in block 106, including current sources for the read, program and erase modes, are coupled to the bit line decoder 103 via data bus 107. Data is supplied via the data-in line 111 from input/output ports on the integrated circuit 150 or from other data circuits 151 internal to the integrated circuit to the data-in structures in block 106. In the illustrated embodiment, other circuitry 151 is included on the integrated circuit 150, such as a general purpose processor or special purpose application circuitry, or a combination of modules providing system-on-a-chip functionality supported by the memory cell array. Data is supplied via the data-out line 115 from the sense amplifiers in block 106 to input/output ports on the integrated circuit 150, or to other data destinations internal or external to the integrated circuit 150.

The array 100 is implemented according to an AND architecture in the embodiments described below, with dielectric charge trapping memory cells arranged in a divided bit line architecture for random access read, erase and program operations.

A controller 109 implemented in this example, using a bias arrangement state machine, controls the application of bias arrangement supply voltages and current sources 108, such as read, program, erase, erase verify, program verify voltages or currents for the word lines and bit lines, source lines and body lines. In dynamic random access embodiments, the controller implements a refresh mode, to periodically refresh the charge stored in the charge trapping devices in the array. The controller 109 can be implemented using special purpose logic circuitry as known in the art. In alternative embodiments, the controller 109 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 109. The controller 109 includes at least logic and bias circuitry having random access read, erase and program modes, wherein the erase mode biases a selected cell to set an erase threshold state in the selected cell, and the program mode biases a selected cell to set a program threshold state in the selected cell.

Figure 2:
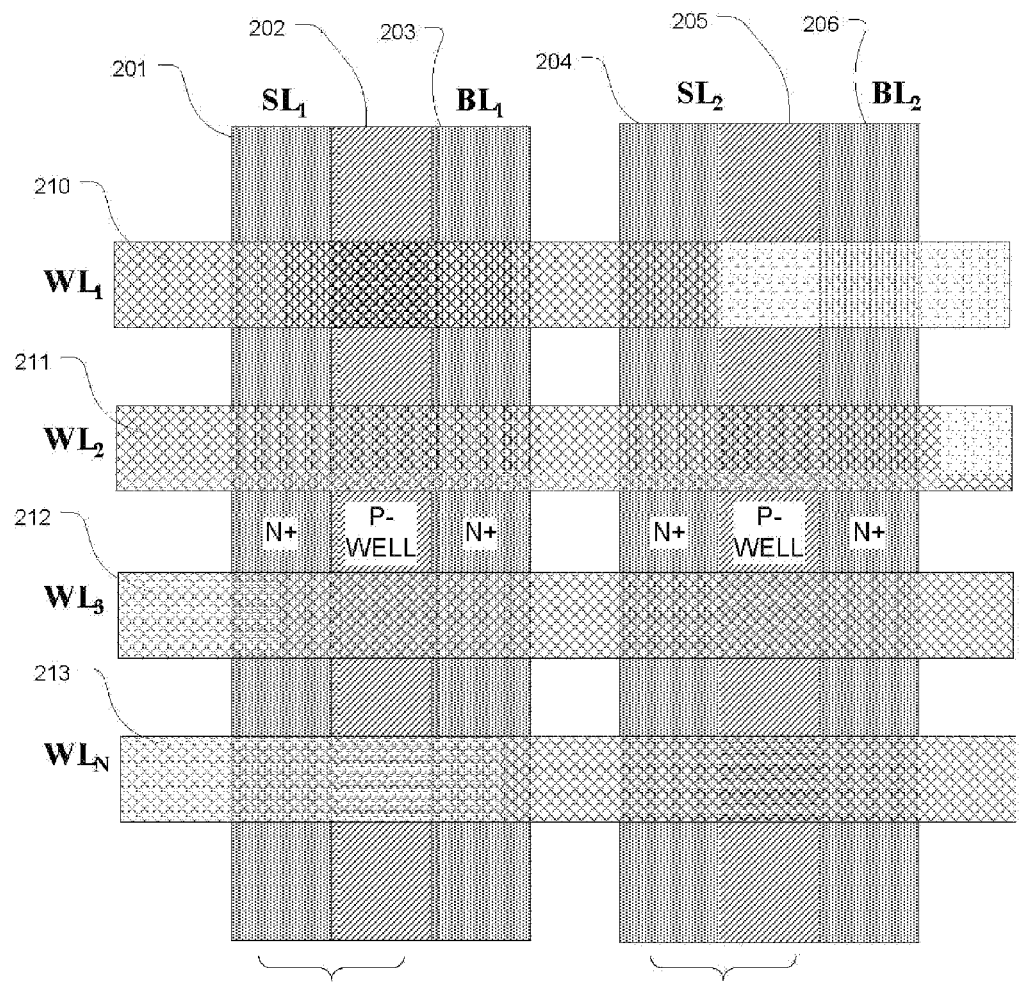
FIG. 2 is a layout view showing a portion of a n-channel, divided bit line array in a SOI configuration as described herein.

FIG. 2 is a layout view of a portion of a divided bit line memory array in a portion of a SOI structure (insulator layer not labeled). A plurality of pairs of semiconductor source/drain lines (201/203, 204/206) are embedded on the insulator layer in the SOI structure. Semiconductor body lines 202, 205 are embedded on insulator layer in the SOI structure between the source and drain lines in respective pairs, and provide channel regions for memory cells in the array. In the illustrated embodiment, the source lines 201, 204 (labeled source line $SL_1$ and source line $SL_2$ respectively) in the array are implemented using n+ doped epitaxial silicon, or other semiconductor materials. Likewise, the drain lines 203, 206 (labeled bit line $BL_1$ and bit line $BL_2$ respectively) in the array are implemented using n+ doped epitaxial silicon, or other semiconductor materials. The pairs of semiconductor source/drain lines (201/203, 204/206) are electrically separated from adjacent pairs to establish the divided bit line architecture. The body lines 202, 205 (p-well) are implemented using p-doped epitaxial silicon, or other semiconductor materials. In the illustrated embodiment, the insulator layer separates the adjacent pairs of source/drain lines. A plurality of word lines 210-213 (labeled $WL_1$, $WL_2$, $WL_3$, $WL_N$) overlies the plurality of pairs of source/drain lines establishing an array of cross points. Although not illustrated in layout view, charge trapping structures lie between the word lines and channel regions in the semiconductor body lines between corresponding pairs of semiconductor source/drain lines forming memory cells at the cross points.

The source lines and semiconductor body lines in the respective columns are coupled together so that both receive common, or similar, bias potentials in the embodiments described herein as indicated by the bracket symbols in the figure. Thus, source line 201 is coupled to in common to the semiconductor body line 202, and source line 204 is coupled to, and in common with, the semiconductor body line 205. The memory cells in a column are arranged in parallel between the source lines and drain lines of the corresponding pair, providing for a relatively low current read operation, along with random access program and erase operations. The area of a memory cell, as can be seen in layout view, may be as small as $8F^2$, where F represents the minimum width of structures like the source line, body line, drain line and word line for the manufacturing processes applied. Other AND-type array devices as described herein may be implemented using polysilicon thin film transistor structures, with laser annealing or other processes used to improve channel properties.

Figure 3:
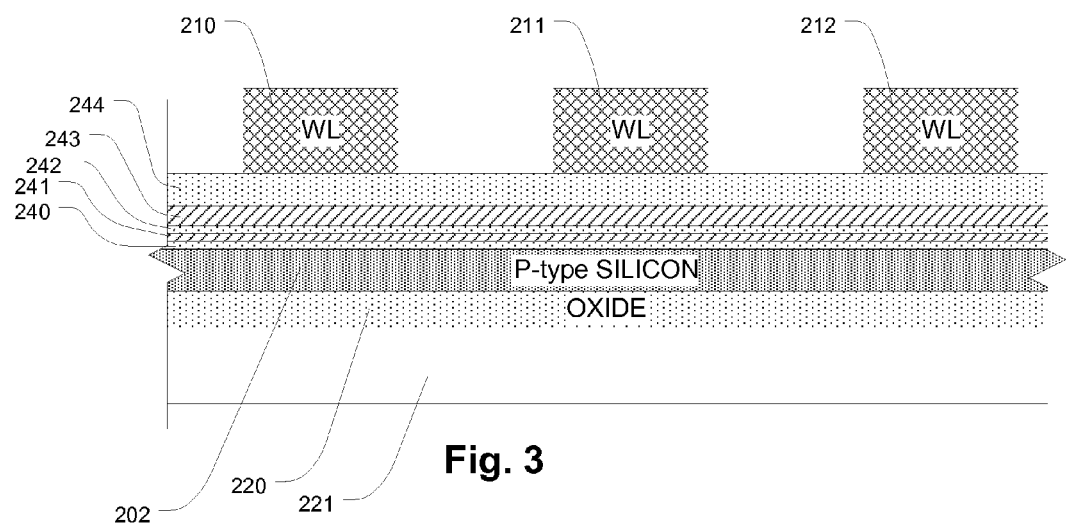
FIG. 3 is a cross-sectional view taken orthogonal to the word lines in a memory array structure like that of FIG. 2, for implementation using nonvolatile, bandgap engineered charge trapping memory cells.

FIG. 3 is a cross-sectional view taken along a semiconductor body line, such as line 202, in the structure of FIG. 2, adapted for hole tunneling between the semiconductor body line 202 and the charge trapping layer 243 (channel injection). The cross-sectional view shows the substrate 221, which may be a single crystal semiconductor chip such as p-type or n-type silicon. An insulator layer 220, such as silicon dioxide, separates the semiconductor body line 202 as well as the pairs of semiconductor source/drain lines (e.g. 201, 203 shown in FIG. 2) from the substrate 221. A multilayer charge trapping structure including layers 240-244, lies between the word lines 210-212 and the semiconductor body line 202. In the illustrated embodiment, the multilayer charge trapping structure is continuous across a plurality of word lines, such as word lines WL1 to WLN in a sector of the array, or across all word lines in the entire array. In alternative structures, the charge trapping structures can be patterned patches which lie, for example, between the word lines and the semiconductor body lines of individual memory cells.

The word lines 210-212 in this embodiment comprise p+ polysilicon, typically with a silicide cap layer. N+ polysilicon may also be used. Other embodiments employ single or multiple layers of materials such as metals, metal compounds or combinations of metals and metal compounds, such as platinum, tantalum nitride, metal silicides, aluminum or other metal or metal compound gate materials (e.g. from Ti, TiN, Ta, Ru, Ir, $RuO_2$, $IrO_2$, W, WN, and others). For some applications, it is preferable to use materials having work functions higher than 4 eV, preferably higher than 4.5 eV. Such materials are typically deposited using sputtering and physical vapor deposition technologies, and can be patterned using reactive ion etching.

In the embodiment illustrated in FIG. 3, the multilayer charge trapping structure includes the dielectric tunneling layer comprising a composite of materials, including a first layer 240, referred to as a hole tunneling layer, a second layer 241 referred to as a band offset layer, and a third layer 242 referred to as an isolation layer. The hole tunneling layer consists of silicon dioxide, for example, on the surface of the semiconductor body line 202, having the thickness less than 20 Å, and preferably 15 Å or less. Representative embodiments are 10 Å or 12 Å thick. The hole tunneling layer may be formed for example using in-situ steam generation ISSG with optional nitridation by either a post deposition NO anneal or by addition of NO to the ambient during deposition.

The second layer 241, referred to as a band offset layer, comprises for example, silicon nitride, having a thickness less than 30 Å, and preferably 25 Å or less, lying on the first layer 240. The silicon nitride layer may be formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor.

The third layer 242, referred to as an isolation layer, comprising for example silicon dioxide, lies on the second layer 241 and may be formed for example using LPCVD high temperature oxide HTO deposition. The thickness of the third layer 242 of silicon dioxide is less than 35 Å, and preferably 30 Å or less. Additional details concerning bandgap engineered tunneling structures can be seen in co-owned and co-pending U.S. patent application Ser. No. 11/324,540; filed Jan. 3, 2006; and in co-owned U.S. Pat. No. 7,315,474; issued Jan. 1, 2008; both of which are incorporated by reference as if fully set forth herein.

A charge trapping layer 243 in this embodiment lies on the multilayer composite tunneling layer. The charge trapping layer 243 comprises silicon nitride, for example, having a thickness greater than 50 Å, including for example about 70 Å in this embodiment. A silicon-rich nitride may be used. A silicon nitride charge trapping layer 243 may be formed for example using low pressure chemical vapor deposition LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006.

A blocking dielectric layer 244 lies between word lines 210, 211, 212 and the charge trapping layer 242. In the illustrated embodiment, the dielectric blocking layer 244 comprises a single layer of insulating material, such as silicon dioxide. Alternatively, the blocking layer 244 comprises a high-K dielectric material, where high-κ refers to materials having a dielectric constant greater than 6 like aluminum oxide $Al_2O_3$, hafnium oxide $HfO_2$, $ZrO_2$, $La_2O_3$, AlSiO, HfSiO, ZrSiO, etc. In alternative embodiments, the blocking layer 244 may comprise a stack including a buffer layer comprising silicon dioxide and a high-κ capping layer (not shown). A blocking dielectric layer 244 of silicon dioxide can be formed by wet conversion from the nitride by a wet furnace oxidation process. Other embodiments may be implemented using high temperature oxide (HTO) or LPCVD $SiO_2$. A blocking dielectric layer 244 of aluminum oxide can be made by atomic vapor deposition, with a post rapid thermal anneal at about 900° C. for 60 seconds to strengthen the film.

Figure 4:
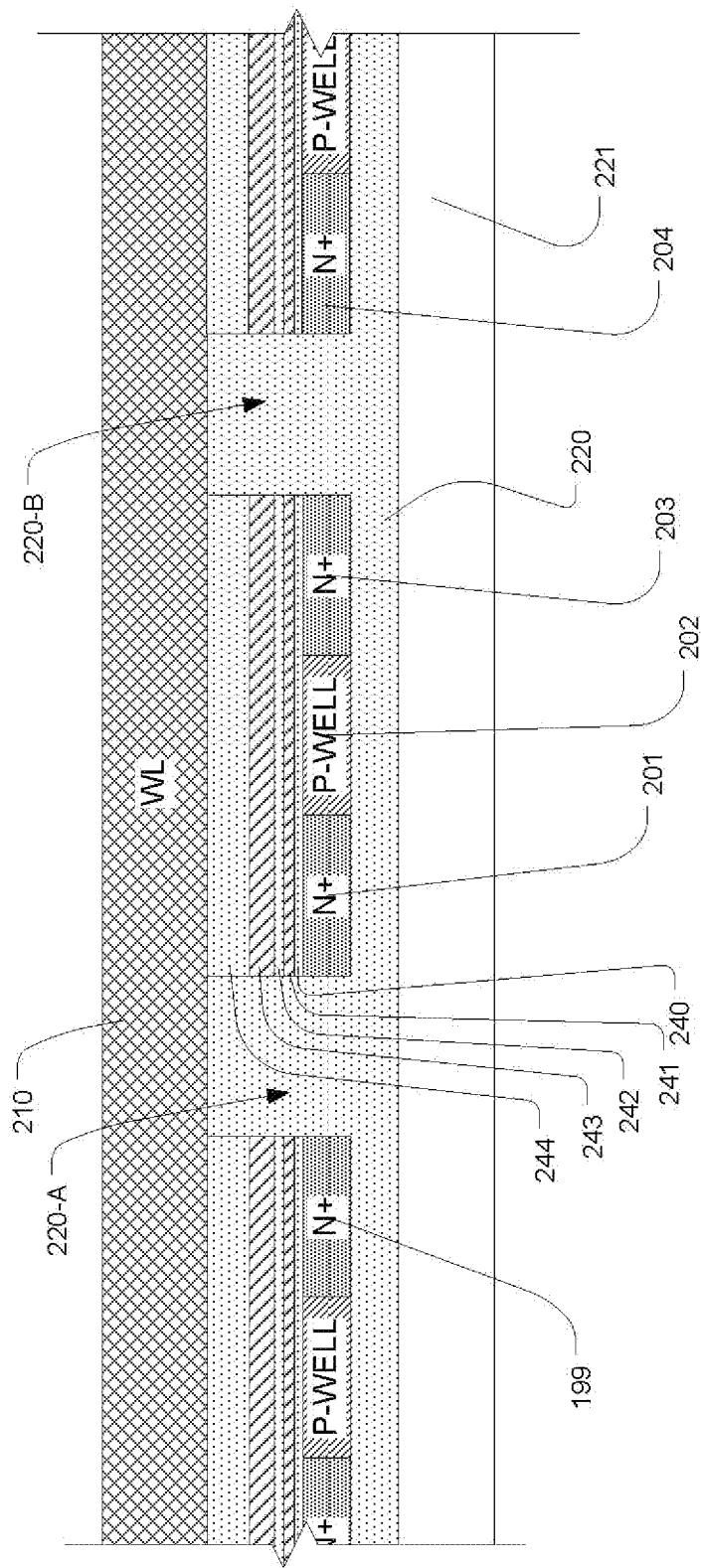
FIG. 4 is a cross-sectional view taken parallel to the word lines in a memory array structure like that of FIG. 2 and FIG. 3.

FIG. 4 is a cross-sectional view taken along a word line, such as word line 210, in the structure of FIG. 2 for the embodiment illustrated in FIG. 3 adapted for hole tunneling between the channel in semiconductor body line 202 and the charge trapping layer 243. The reference numbers shown in FIG. 4 are the same as used for corresponding elements in FIG. 3 and the description of such elements is not repeated here. FIG. 4 illustrates the divided bit line structure in which the source line 201 is divided from the drain line 199 in an adjacent column of memory cells by a region 220-A of the insulator layer 220. Likewise, the drain line 203 is divided from the source line 204 in the adjacent column by a region 220-B in insulator layer 220.

A representative technique for manufacturing the structure includes first forming an insulator layer 220 on the substrate 221, and planarizing the insulator layer 220. Then, a layer of epitaxial silicon is grown on the planarized structure. The semiconductor material is then masked according to a pattern defining the pairs of source/drain lines and the semiconductor body lines. Dopants are implanted according to the pattern process to define the N+ lines and the p-type well lines. Next, the dielectric charge trapping structure is formed over the array. Then, trenches are etched between the columns of pairs of source/drain lines and filled with the insulator material in the regions 220-A and 220-B. The resulting structure is again planarized, and then word line material is deposited and patterned to define the word lines in the array.

Figure 5:
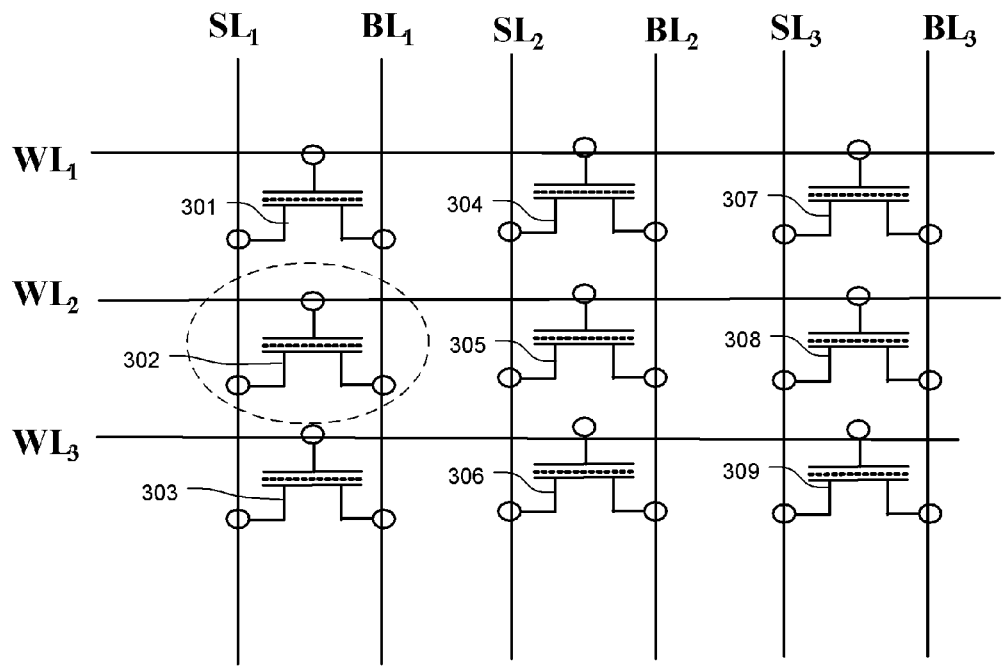
FIG. 5 is a circuit schematic diagram of a memory array implemented as shown in FIG. 2, including bias voltages for a random access program operation.
Figure 6:
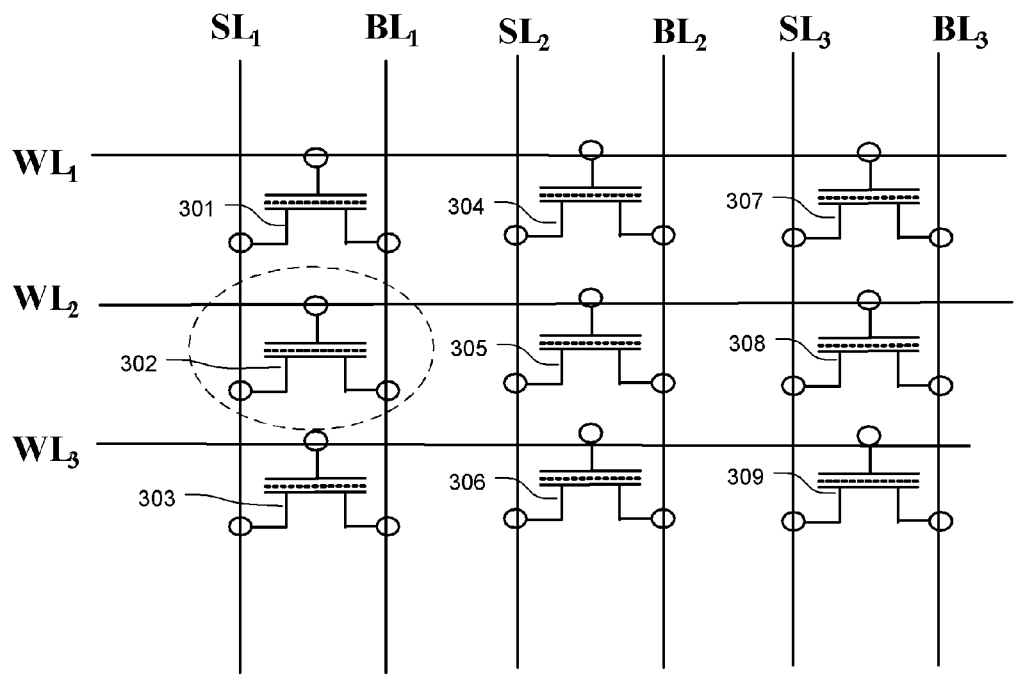
FIG. 6 is a circuit schematic diagram of a memory array implemented as shown in FIG. 2, including bias voltages for a random access erase operation.
Figure 7:
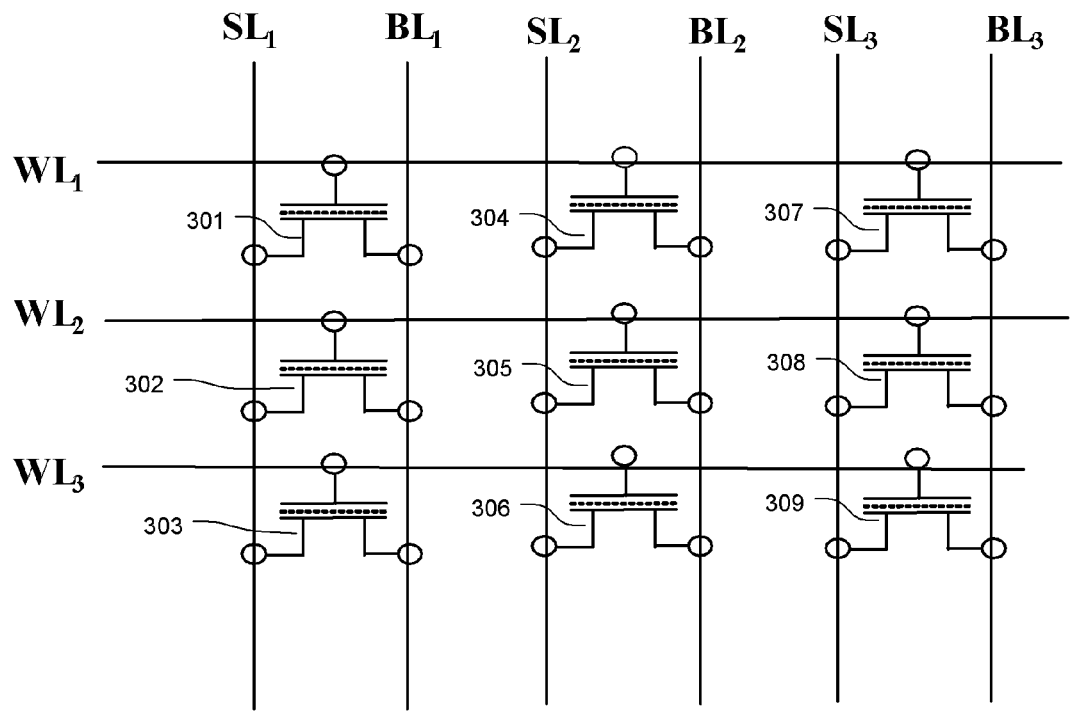
FIG. 7 is a circuit schematic diagram of a memory array implemented as shown in FIG. 2, including bias voltages for a random access read operation.

FIGS. 5-7 are schematic diagrams of a divided bit line array implemented as described above, and also illustrate biasing arrangements for random access program, random access erase and random access read mode operations respectively. Nine individual memory cells 301-309 are illustrated in the schematic. Actual arrays implemented as described herein may include large numbers of sectors, where each sector for example includes between 16 and 128 word lines and between 512 and 2048 bit lines. Even larger numbers of word lines and bit lines may be arranged in a random access array as needed for a particular implementation. Memory cells 301-303 are connected in parallel between source line $SL_1$ and bit line $BL_1$, memory cells 304-306 are connected in parallel between source line SL$_2$ and bit line BL$_2$, and a memory cells 307-309 are connected in parallel between source line SL$_3$ and bit line BL$_3$.

In a program mode for programming a selected memory cell, such as memory cell 302, the control circuitry on the integrated circuit biases the selected cell to cause electron tunneling to set a program threshold state in the selected cell. The bias voltage therefore must establish an electric field across the charge trapping structure sufficient to induce electron tunneling through the tunneling layer into the charge trapping structure that may cause an increase in the threshold voltage of the memory cell to target level for the program state. The magnitude of the bias voltage across the charge trapping structure is referred to herein as the program voltage V$_{PGM}$, and may be on the order of 14 to 22 Volts in representative embodiments. According to a method of operating the memory cells described herein, the source line (e.g. SL$_1$), body and bit line (e.g. BL$_1$) coupled to the selected memory cell (e.g. 302) receive a negative bit line program voltage and the word line (e.g. WL$_2$) coupled to the selected cell receives a positive word line program voltage. The un-selected word lines and bit lines are coupled to a ground potential or other common reference voltage. The sum of the negative bit line program voltage and the positive word line program voltage equals the program voltage V$_{PGM}$ for the memory cell, and induces an electric field across the tunneling layer that causes electron tunneling from the source line/drain line and/or channel into the charge trapping layer of the charge trapping structure.

The negative bit line program voltage and the positive word line program voltage are selected to prevent disturbance of the memory state of other cells on the selected word line or the selected bit line. Thus for example, memory cells 305 and 308 coupled to the selected word line (WL$_2$) are also exposed to the positive word line program voltage, and memory cells 301 and 303 coupled to the selected bit line (BL$_1$) are also exposed to the negative bit line program voltage.

In a preferred embodiment, a negative bit line program voltage is a level near or equal to $-V_{PGM}/2$, and the positive word line program voltage is a level near or equal to $+V_{PGM}/2$. In this way, the maximum electric field capable of causing disturbance of other memory cells in the array has about one half the magnitude of that used for programming. The program voltage V$_{PGM}$, bit line program voltage and word line program voltage are selected according to a trade-off considering the charge trapping structure, between programming speed (higher magnitude for V$_{PGM}$), and maximum charge leakage tending to disturb the memory state of neighboring memory cells (lower magnitude for the bit line program voltage and word line program voltage). Therefore, actual embodiments may use word line program voltages and bit line program voltages that have magnitudes about one half that of the program voltage, varying from precisely one half by amounts that do not cause significant imbalance in the electric fields that would tend to disturb charge storage in memory cells on the selected word line compared to memory cells on the selected bit line. Variations in the magnitude of such voltages can be accounted for by differences between the electric fields induced in the tunneling layers by a given magnitude of voltage on the bit line compared to electric fields induced in the tunneling layers by the same magnitude of voltage on the word line.

In general, for the purposes of this application, it is considered that memory cells are not disturbed by the bit line program voltage or the word line program voltage so long as their memory state is not changed within a reasonable number of read, program and erase operation cycles such as 10,000 to 100,000 or more for nonvolatile implementations, or within a number of read, program and erase operation cycles which may occur between refresh cycles in a dynamic random access implementation.

As illustrated in FIG. 6, in an erase mode for erasing a selected memory cell, such as memory cell 302, the control circuitry on the integrated circuit biases the selected cell to cause hole tunneling to set an erase threshold state in the selected cell. The bias voltage therefore must establish an electric field across the charge trapping structure sufficient to induce hole tunneling into the charge trapping structure that may cause a decrease in the threshold voltage of the memory cell to target level for the erase state. The magnitude of the bias voltage across the charge trapping structure is referred to herein as the erase voltage V$_{ERS}$. According to a method of operating the memory cells described herein, the source line (e.g. SL$_1$), body and bit line (e.g. BL$_1$) coupled to the selected memory cell (e.g. 302) receive a positive bit line erase voltage and the word line (e.g. WL$_2$) coupled to the selected cell receives a negative word line erase voltage. The un-selected word lines and bit lines are coupled to a ground potential or other common reference voltage. The sum of the positive bit line erase voltage and the negative word line erase voltage equals the erase voltage V$_{ERS}$ for the memory cell, and induces an electric field that causes hole tunneling from the source line/drain line and/or channel into the charge trapping layer of the charge trapping structure.

The positive bit line erase voltage and the negative word line erase voltage are selected to prevent disturbance of the memory state of other cells on the selected word line or the selected bit line. Thus for example, memory cells 305 and 308 coupled to the selected word line (WL$_2$) are also exposed to the negative word line erase voltage, and memory cells 301 and 303 coupled to the selected bit line (BL$_1$) are also exposed to the positive bit line erase voltage.

In a preferred embodiment, a positive bit line erase voltage is a level near or equal to $+V_{ERS}/2$, and the negative word line erase voltage is a level near or equal to $-V_{ERS}/2$. In this way, the maximum electric field capable of causing disturbance of other memory cells in the array has about one half the magnitude of that used for erasing. The erase voltage V$_{ERS}$, bit line erase voltage and word line erase voltage are selected according to a trade-off considering the charge trapping structure, between erasing speed (higher magnitude for V$_{ERS}$), and maximum charge leakage tending to disturb the memory state of neighboring memory cells (lower magnitude for the bit line erase voltage and word line erase voltage). Therefore, actual embodiments may use word line erase voltages and bit line erase voltages that have magnitudes about one half that of the erase voltage, varying from precisely one half by amounts that do not cause significant imbalance in the electric fields that would tend to disturb charge storage in memory cells on the selected word line compared to memory cells on the selected bit line. Variations in the magnitude of such voltages can be accounted for by differences between the electric fields induced in the tunneling layers by a given magnitude of voltage on the bit line compared to electric fields induced in the tunneling layers by the same magnitude of voltage on the word line.

As illustrated in FIG. 7, during a read mode operation, the source line SL$_1$ and body of a selected memory cell are coupled to ground, the bit line BL$_1$ of a selected memory cell is coupled to a bit line read voltage and the word line of a selected memory cell is coupled to a word line read voltage. Thus, for reading memory cell 302, BL$_1$ receives a positive bit line read voltage, and WL$_2$ receives a positive word line read voltage. Unselected bit lines and word lines are coupled to ground. Very fast random access read operations are possible using reasonable read voltages that do not cause disturbance of unselected memory cells in the array.

Figure 8:
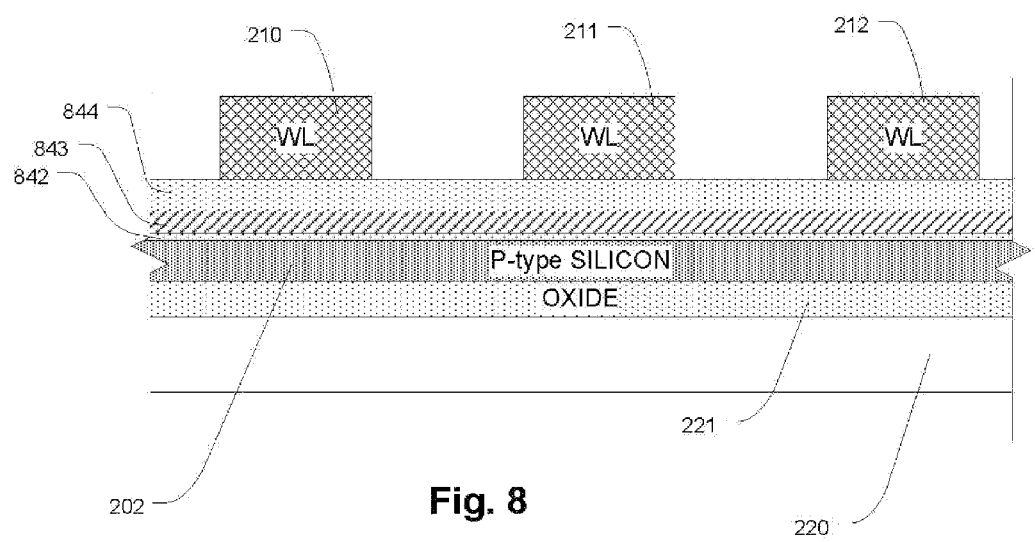
FIG. 8 is a cross-sectional view taken orthogonal to the word lines in a memory array structure like that of FIG. 2, for implementation using charge trapping memory cells adapted for use in a system providing for refresh operations, such as used in dynamic random access memory devices.

FIG. 8 shows in alternative embodiment adapted for very high speed random access, for use combined with a control circuitry including a refresh mode. The reference numerals used in FIG. 3 are used in FIG. 8 for corresponding elements. The charge trapping structure in FIG. 8 is implemented according to an alternative application, and includes a tunneling layer 842, a charge trapping layer 843, and a blocking layer 844. In order to implement very high-speed random access for reading, program and erase, very thin tunneling layer 842 is utilized, such as a layer of silicon dioxide having a thickness less than 1.5 nm, or about 1 nm or less in some embodiments. The charge trapping layer 843 and blocking layer 844 may be implemented as described above with reference to FIG. 3. Refresh cycles must be executed for a memory cell implemented as shown in FIG. 8, in order to correct for charge leakage through the tunneling layer 842. For example, a refresh cycle as commonly used in DRAM technology can be executed so that each memory cell has its memory state refreshed at least once every 10 to 100 milliseconds in representative embodiments. Shorter or longer refresh cycles could be implemented according to the particular characteristics of the memory cell charge storage dynamics.

Figure 9:
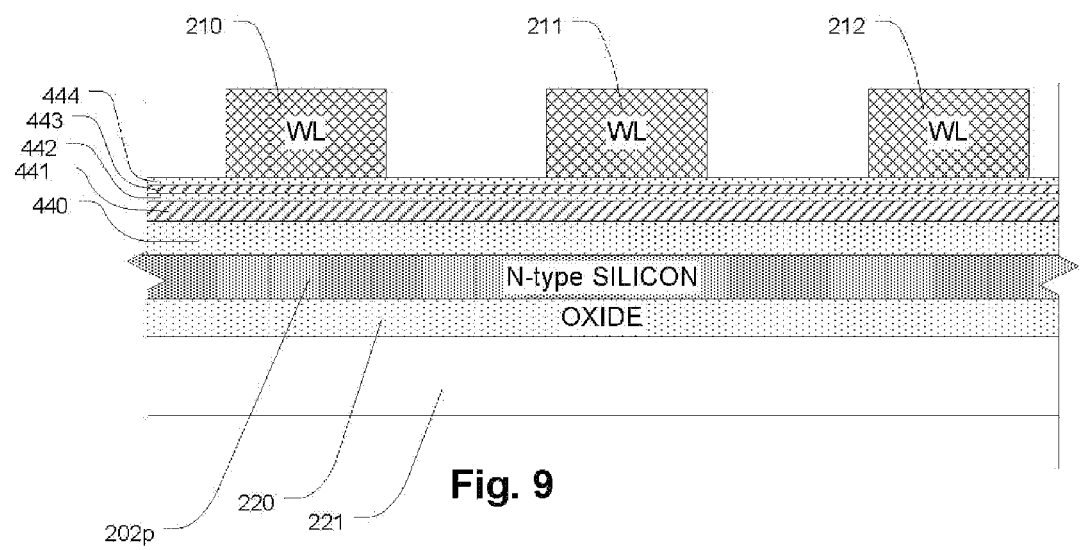
FIG. 9 is a cross-sectional view taken orthogonal to the word lines in a memory array structure like that of FIG. 11, showing a p-channel embodiment adapted for gate injection hole tunneling.

FIG. 9 illustrates an implementation like that of FIG. 3 in which the tunneling layer is implemented between the word line 210 and the charge trapping layer 441, and the body line 202p of N-type silicon for a p-channel device using gate injection operation. Reference numerals used in FIG. 3 are used again in FIG. 9 for corresponding elements and not described again. The charge trapping structure in FIG. 9 includes a blocking layer 440 on the semiconductor body line 202, and a charge trapping layer 441 on the blocking layer 440. The blocking layer 440 and charge trapping layer 441 are implemented as described above. The tunneling layer in the embodiment of FIG. 9 is a multilayer structure including an isolation layer 442 on the charge trapping layer 441, a band offset layer 443 on the isolation layer 442, and a tunneling layer 444 on the band offset layer 443. In this embodiment, electron and hole tunneling for program and erase operations occurs between the word line 210 and the charge trapping layer 441. As mentioned above, the multilayer tunneling structure (442, 443, 444) could be replaced by a single layer of silicon dioxide or other tunneling material.

Figure 10:
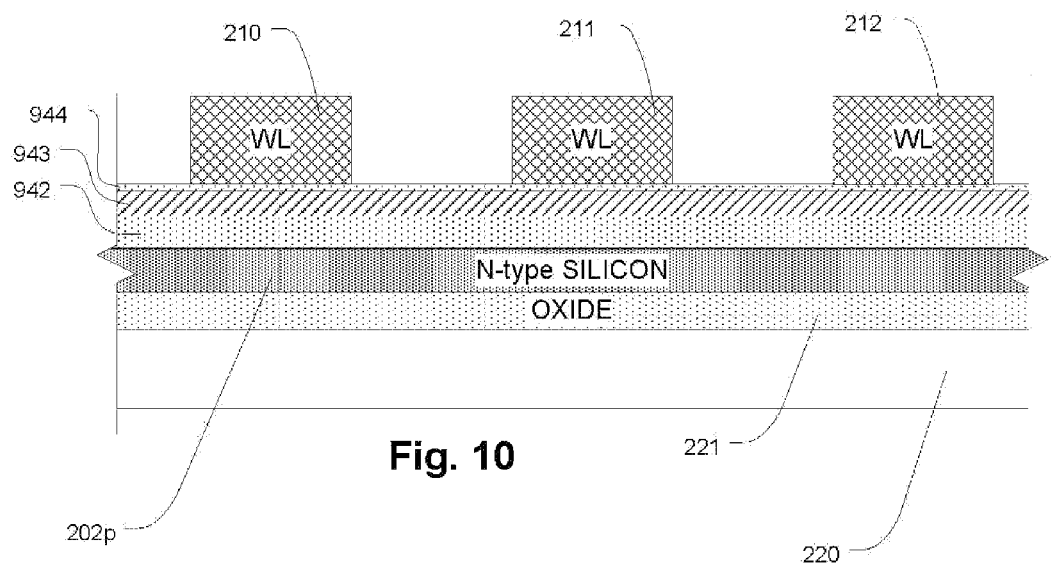
FIG. 10 is a cross-sectional view taken orthogonal to the word lines in a memory array structure like that of FIG. 11, showing a p-channel embodiment adapted for gate injection hole tunneling in a system providing for refresh operations.

FIG. 10 illustrates an implementation like that of FIG. 8, in which the ultrathin tunneling layer 944 is implemented between the word line 210 and the charge trapping layer 943, and the body line 202p of N-type silicon for a p-channel device used for gate injection operation. Reference numerals used in FIG. 3 are used again in FIG. 10 for corresponding elements and not described again. The charge trapping structure in FIG. 10 includes a blocking layer 942 on the semiconductor body line 202, and a charge trapping layer 943 on the blocking layer 942. The blocking layer 942 and charge trapping layer 943 are implemented as described above. The tunneling layer 944 in the embodiment of FIG. 10 comprises a single layer of silicon dioxide or silicon oxynitride having a thickness of less than 1.5 nm or less than 1 nm and is therefore adapted for use in a dynamic random access mode, on an integrated circuit supporting a refresh operation.

Figure 11:
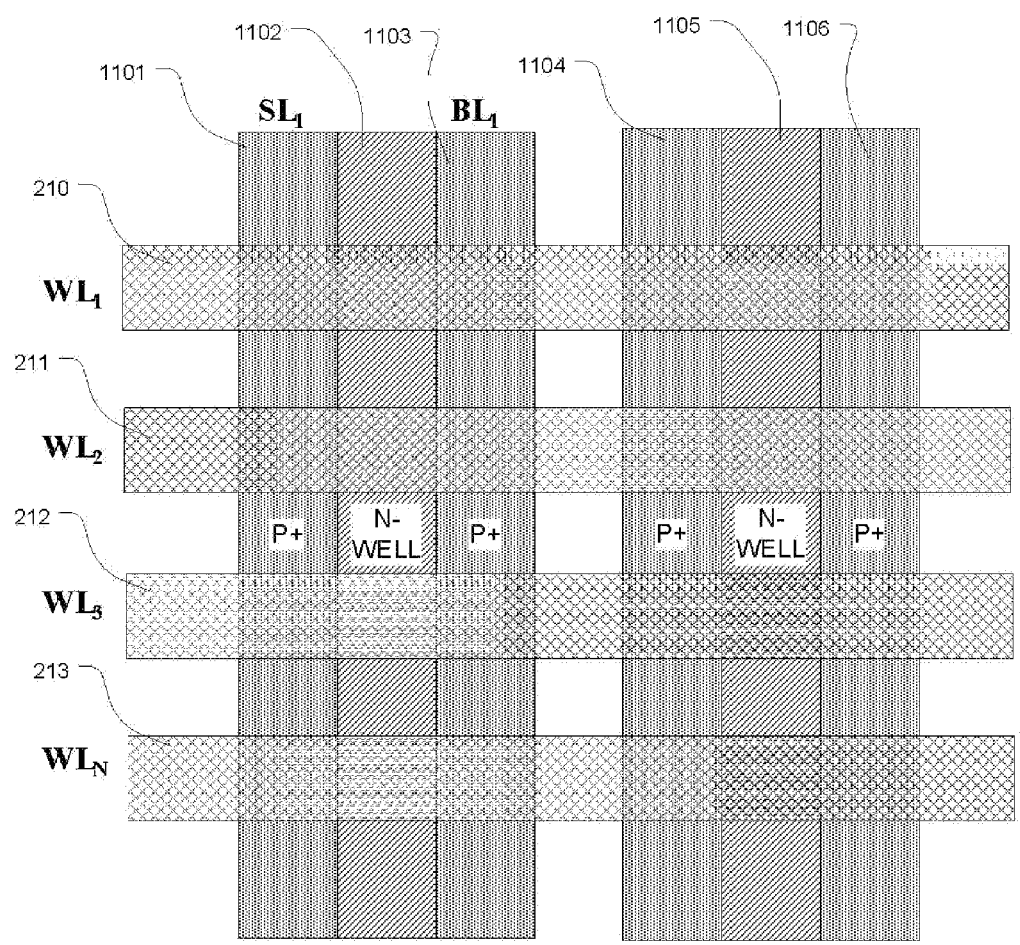
FIG. 11 is a layout view showing a portion of a p-channel, divided bit line array in a silicon-on-insulator configuration.

FIG. 11 is a layout view like that of FIG. 2 illustrating a p-channel embodiment. In the embodiment of FIG. 11, the semiconductor source and drain lines 1101, 1103, 1104, 1106 comprise P+ silicon and the semiconductor body lines 1102, 1105 comprise n-type silicon. Otherwise, the structure is essentially the same as that of FIG. 2, and the same reference numerals are utilized.

Figure 12:
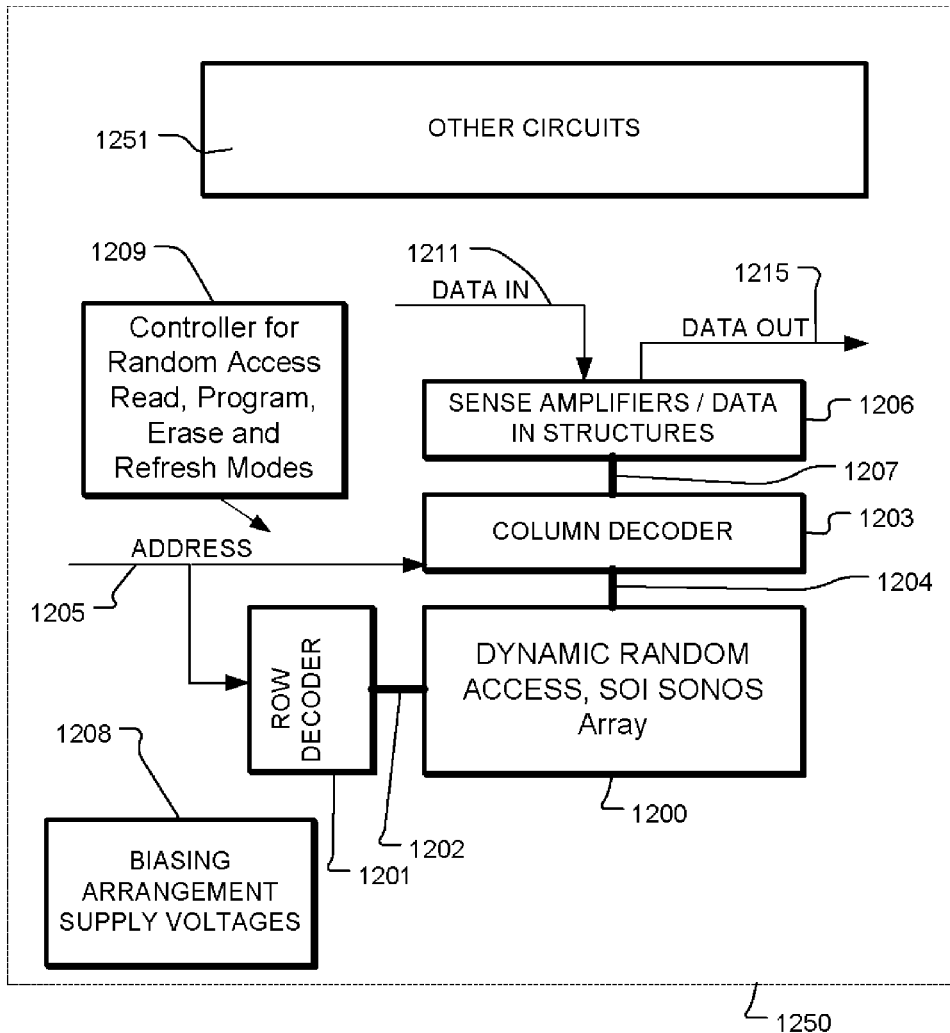
FIG. 12 is simplified block diagram of an integrated circuit including a memory array which comprises one-transistor, dielectric charge trapping memory cells arranged in a divided bit line architecture in a SOI configuration, and adapted for dynamic random access read, refresh, erase and program operations.

FIG. 12 is a simplified block diagram of an integrated circuit 1250 including a substrate which may be a single chip or multiple chips adapted for packaging together in a single integrated circuit package, and a memory array 1200 in a first region of substrate which comprises an array of one-transistor, dielectric charge trapping memory cells like those of FIG. 8 or FIG. 10, arranged in a divided bit line architecture in a SOI configuration, and adapted for dynamic random access read, erase and program operations supported by a refresh operation. A word line (or row) and block select decoder 1201 is coupled to, and in electrical communication with, a plurality 1202 of word lines and block select lines, and arranged along rows in the memory array 1200. A bit line (column) decoder and drivers 1203 are coupled to and in electrical communication with a plurality of bit lines 1204 arranged along columns in the memory array 1200 for reading data from, and writing data to, the memory cells in the memory array 1200. Addresses are supplied on bus 1205 to the word line decoder and drivers 1201 and to the bit line decoder 1203. Sense amplifiers and data-in structures in block 1206, including current sources for the read, program and erase modes, are coupled to the bit line decoder 1203 via data bus 1207. Data is supplied via the data-in line 1211 from input/output ports on the integrated circuit 1250 or from other data circuits 1251 internal to the integrated circuit to the data-in structures in block 1206. In the illustrated embodiment, other circuitry 1251 is included on the integrated circuit 1250, such as a general purpose processor or special purpose application circuitry, or a combination of modules providing system-on-a-chip functionality supported by the memory cell array. Data is supplied via the data-out line 1215 from the sense amplifiers in block 1206 to input/output ports on the integrated circuit 1250, or to other data destinations internal or external to the integrated circuit 1250.

The array 1200 is implemented according to an AND architecture in the embodiments described below, with dielectric charge trapping memory cells arranged in a divided bit line architecture for random access read, erase and program operations.

A controller 1209 implemented in this example, using a bias arrangement state machine, controls the application of bias arrangement supply voltages and current sources 1208, such as read, refresh, program, erase, erase verify, program verify voltages or currents for the word lines, body line, source lines and bit lines. The controller 1209 can be implemented using special purpose logic circuitry as known in the art. In alternative embodiments, the controller 1209 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 1209. The controller 1209 includes at least logic and bias circuitry having random access read, erase, program and refresh modes, wherein the erase mode biases a selected cell to set an erase threshold state in the selected cell, and the program mode biases a selected cell to set a program threshold state in the selected cell. In the refresh mode, memory cells are periodically accessed, such as every 10 to 100 msec, and their charge storage levels refreshed, by either a program operation or an erase operation, to offset any charge leakage that may occur between refresh cycles on the memory cell.

Figure 13:
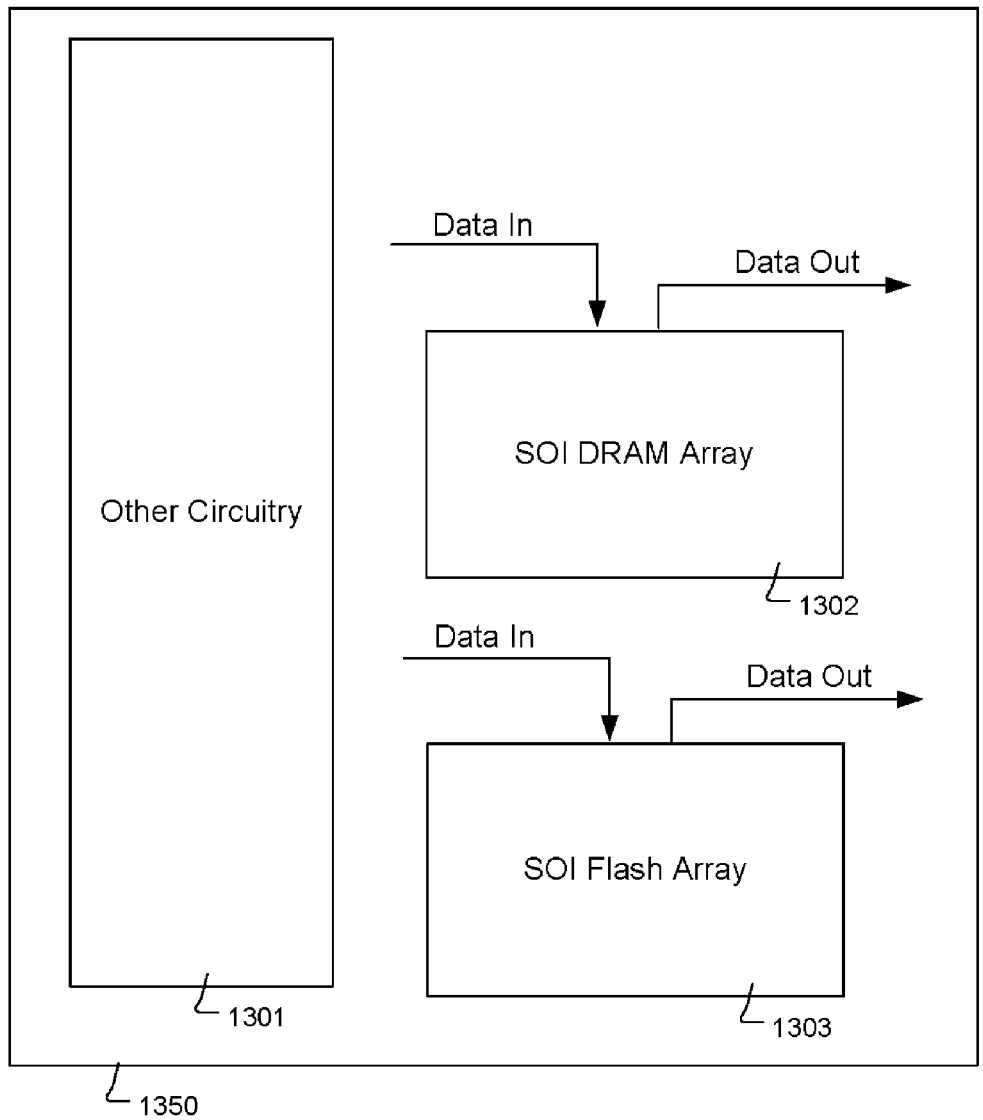
FIG. 13 is a simplified block diagram of an integrated circuit including both nonvolatile random access and dynamic random access memory arrays on a single substrate, in which both arrays comprise one-transistor, dielectric charge trapping memory cells arranged in a divided bit line architecture in a SOI configuration.

FIG. 13 illustrates a system chip implementation including both a dynamic access memory array and nonvolatile memory array having similar divided bit line structures as illustrated above. In the embodiment illustrated, an integrated circuit 1350 includes a SOI DRAM array 1302 implemented with memory cells like those of FIG. 8, along with the supporting control circuitry (not shown), along with a SOI flash array 1303 implemented with memory cells like those of FIG. 2, along with the supporting control circuitry (not shown). Other circuitry 1301 on the array is arranged to read and write data into and out of the various arrays according to the operational requirements of the mission functions being executed. The array 1302 and array 1303 are implemented on a single integrated circuit which comprises a single chip or multiple chips arranged for packaging in a single integrated circuit package. Preferably, both arrays are implemented on a single chip, so that the similar manufacturing processes used for the two different arrays can be leveraged for efficient and low-cost manufacturing of system-on-a-chip devices.

A novel 1T DRAM memory is proposed having high endurance (>1G Times), using a 1T charge-trapping DRAM cell, operated using gate injection program/erase processes. A silicon-rich nitride trapping layer is used in this embodiment. The device uses a SONS structure, with nitride-trapping layer in direct contact with the poly gate. Program and erase operations are carried out by gate injection in order to avoid damage to the bottom oxide. The SONS structure using no tunneling oxide layer gives fast program/erase speed, yet nitride storage gives good data retention and thus long refreshing time. Also, using a gate dielectric layer of silicon oxide or silicon oxynitride that is not subjected to tunneling operations improves endurance of the memory device. Also, a silicon-rich nitride that has higher capture efficiency at low voltage is used in this example as the charge-trapping layer. The device can be characterized by pulse-IV technique in order to accurately measure the transient response. Large current window (>10 µA) can be obtained within 1 µsec at low voltage (<7 V). Because the program/erase operations are through the gate poly directly into (or out of) the SiN without stressing the bottom oxide, high endurance (>10G) is achieved. This charge-trapping DRAM offers longer retention (>1 sec) and negligible programming current (~pA) than both conventional 1T1C and floating-body 1T DRAM, thus providing low-power operation. An AND-type SOI array is proposed to offer random program/erase and read.

A silicon-rich nitride is introduced for use in the charge trapping layer to greatly enlarge the memory window. The typical silicon nitride is $Si_3N_4$. So the ratio of Si to N atoms is 3:4 in the typical silicon nitride thin films. For the silicon-rich nitride $Si_xN_y$, the ratio of X to Y is greater than 3:4. The ratio for embodiments of the charge trapping structures may range from 3.1:4 to 4:4 for example. Another useful parameter is the optical index of refraction (n), measured at "633 nm" using an optical elipsometer. The index of refraction is n=2.0 for standard silicon nitride. A typical range for silicon-rich nitride in our experiments is 2.05 to 2.1.

In addition, since 1T cells are susceptible to gate disturb even in read mode, the conventional DC-IV measurement is not suitable for the device characterization. Therefore, we employ pulse-IV measurements to accurately characterize the device performance and to examine the transient behavior.

Figures 14A, 14B, 14C:
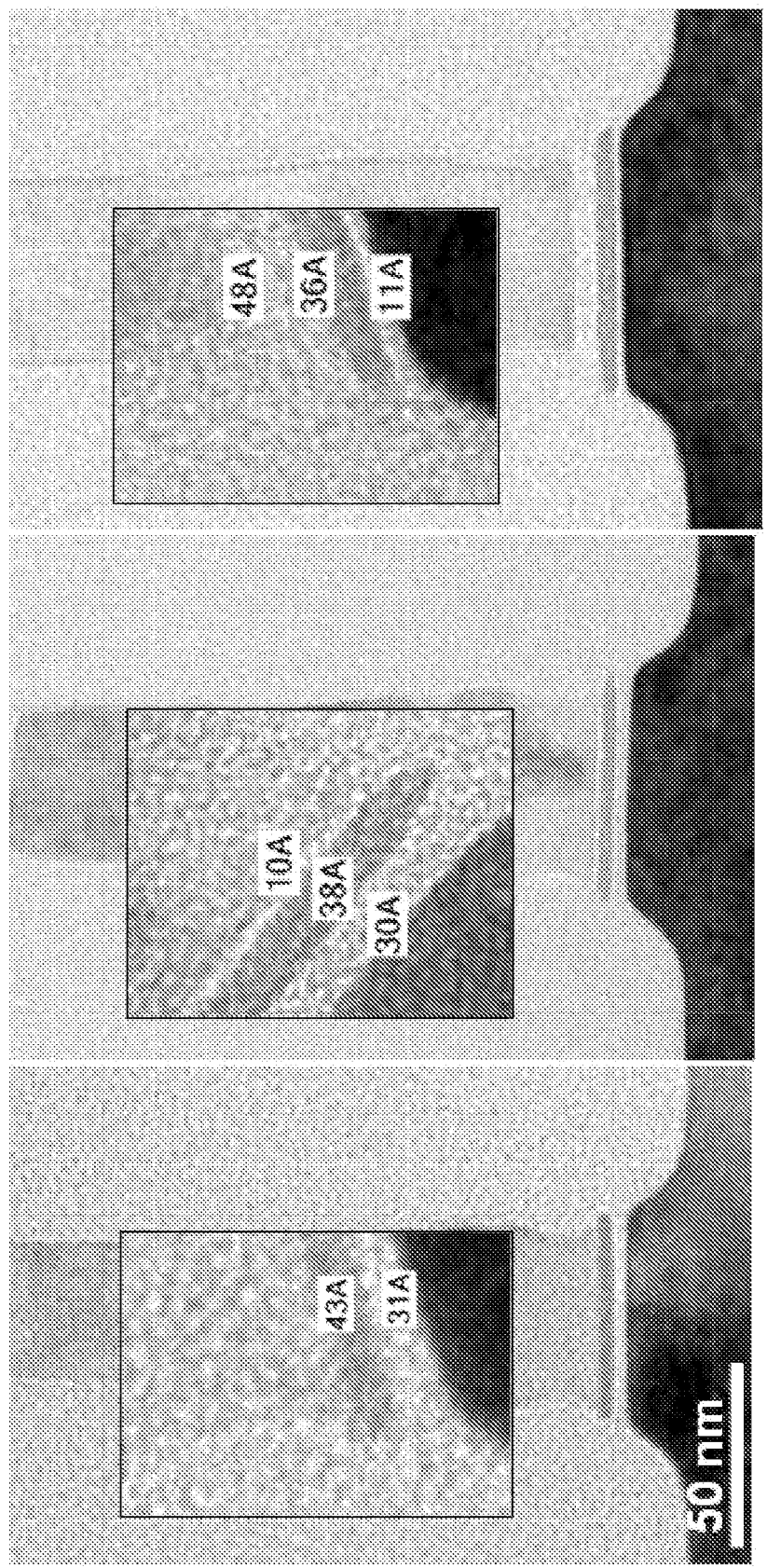
FIGS. 14a-14c are channel-length cross-sectional photographs of (a) SONS (without top oxide), (b) SONoS (with thin top oxide), and (c) SoNOS (with thin bottom oxide). The inserts show the corresponding thicknesses of the layers of oxide and nitride.

The device cross-sectional views of the 50 nm "SONS" (without top oxide), "SONoS" (with thin top oxide), and "SoNOS" (with thin bottom oxide) are illustrated in FIGS. 14a-14c. The insets show the corresponding ONO thickness. Both n-channel and p-channel devices are fabricated.

Figure 15A:
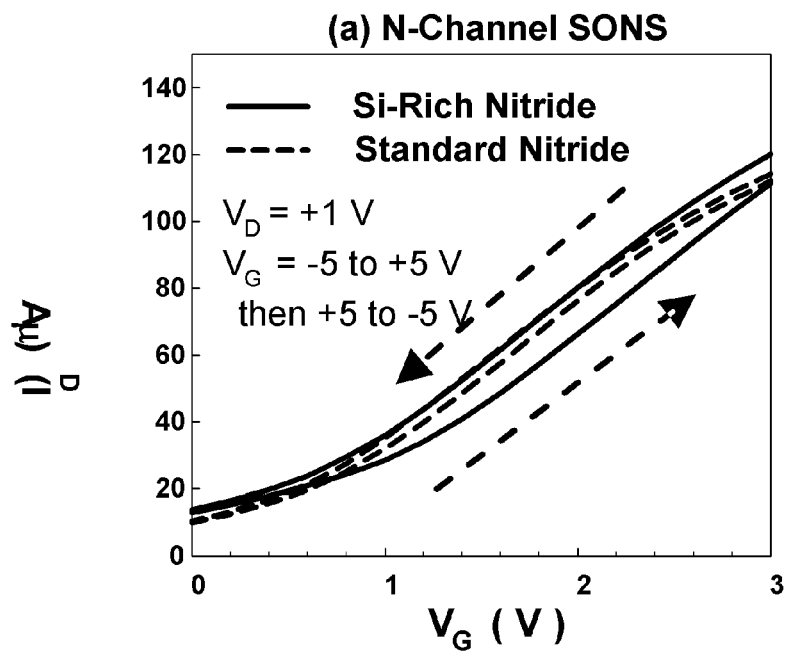
FIGS. 15a-15b are graphs comparing dual-sweep DC current versus voltage curves DC-IV for different nitride compositions, where
Figure 15B:
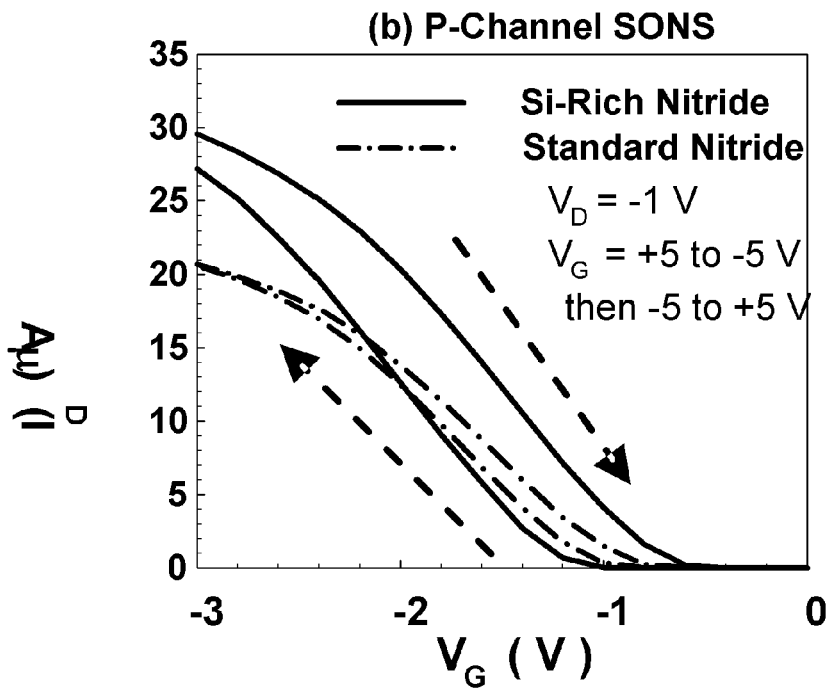

The conventional DC-IV measurements are carried out by dual-voltage sweeps (from Vg=−5 to +5 V, and then +5 to −5 V). The results in FIGS. 15a-15b show that all the devices have very significant hysteresis. This indicates that the devices are easily programmed/erased under low voltages. Moreover, silicon-rich nitride shows much larger hysteresis than the standard nitride. This suggests that silicon-rich nitride is more efficient in trapping charges at low voltage. Furthermore, the p-channel device shows slightly larger memory window than the n-channel device. A p-channel device can be preferred for gate-injection operation. See, H. T. Lue et al, VLSI Tech. Dig., 2007, pp. 140-141.

The large hysteresis also suggests that the conventional DC-IV measurement to define threshold voltage (See, C. H. J. Wann, et al, in IEDM Tech. Dig., 1995, pp. 867-870) is not appropriate since these devices are easily disturbed. Therefore, we employ pulse-IV measurement to accurately characterize these devices.

Figure 16A:
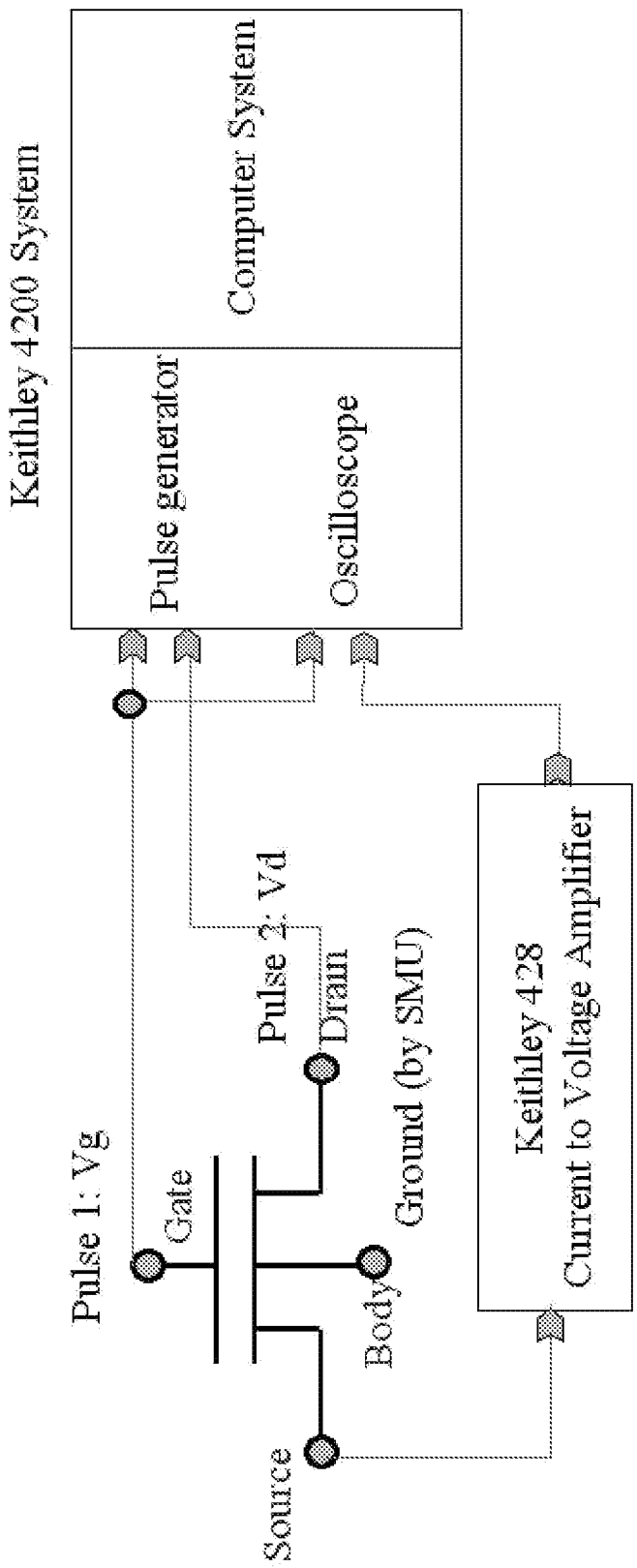
FIG. 16a is a diagram of a set up for measuring Pulse-IV characteristics, in which a read current can be measured immediately after a program/erase operation.
Figure 16B:
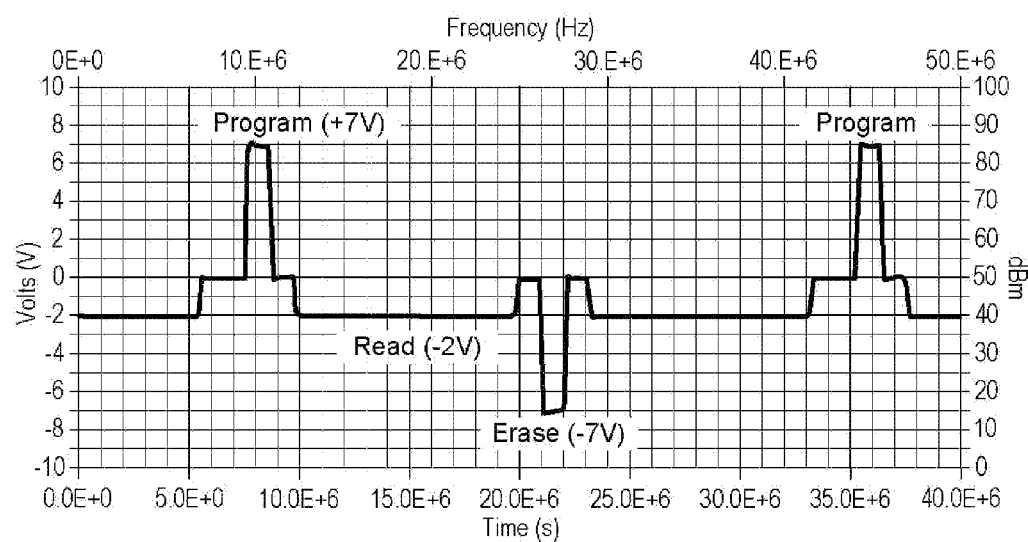
FIG. 16b shows a measured gate voltage pulse used during P/E cycle stressing of the p-channel device.
Figure 16C:
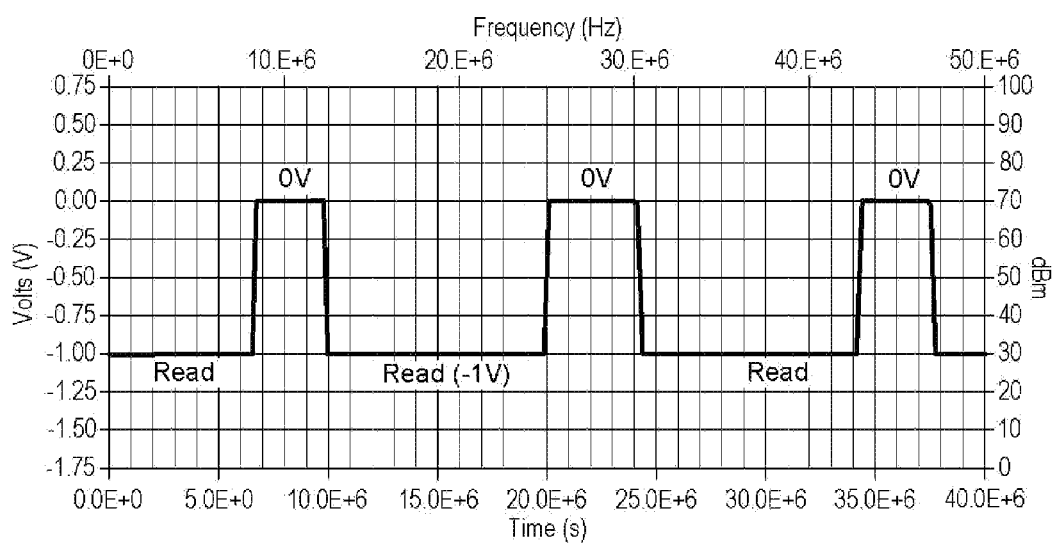
FIG. 16c shows a measured drain voltage pulse used during P/E cycle stressing of the p-channel device.
Figure 17:
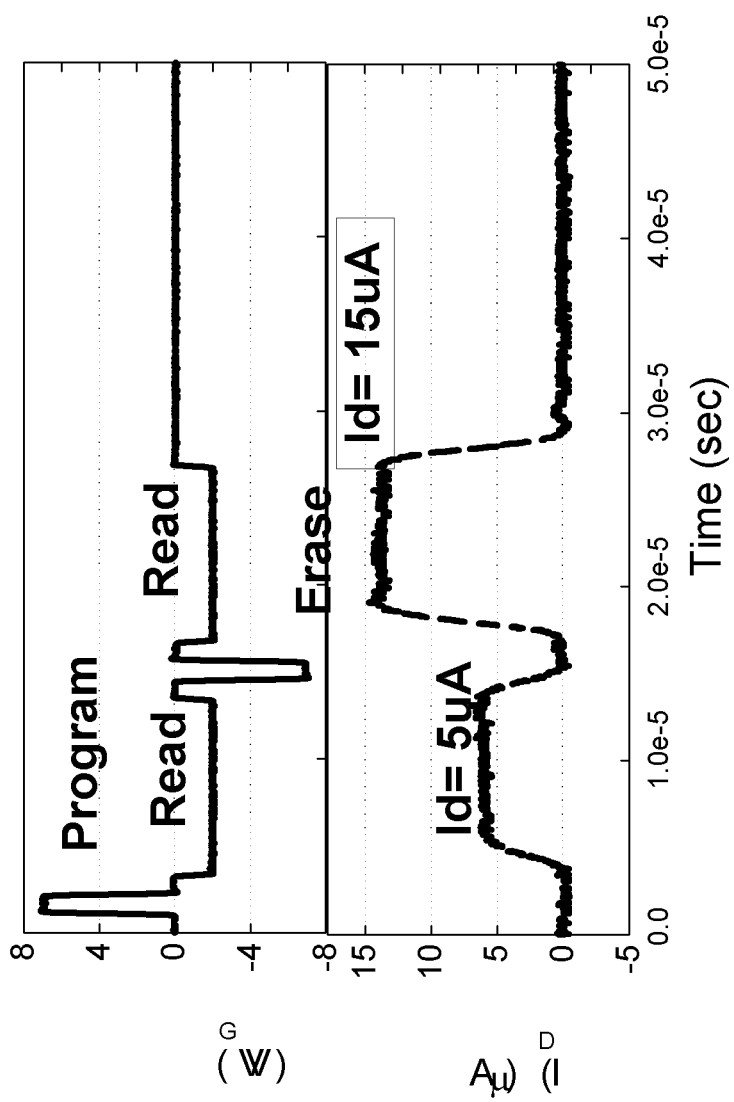
FIG. 17 is a graph showing measured drain current response of the device under P/E cycling stress, showing a large current difference (~10 μA) between the drain current after program and the drain current after erase.

The pulse-IV setup is shown in FIG. 16(a). FIGS. 16(b) and (c) show the gate and drain voltage pulses during P/E cycling stressing, respectively. The typical drain current response for the p-channel SONS is shown in FIG. 17. Programmed state has smaller drain current, while erased state has larger current. The large current difference (~10 µA) provides excellent design window for fast-reading applications.

Instead of the conventional VT vs. time measurements, we measure the drain current ($I_D$) after program/erase pulse because this is what actually measured by the sense amplifier. Moreover, $V_T$ can not be suitably measured during the transient pulse.

Figure 18A:
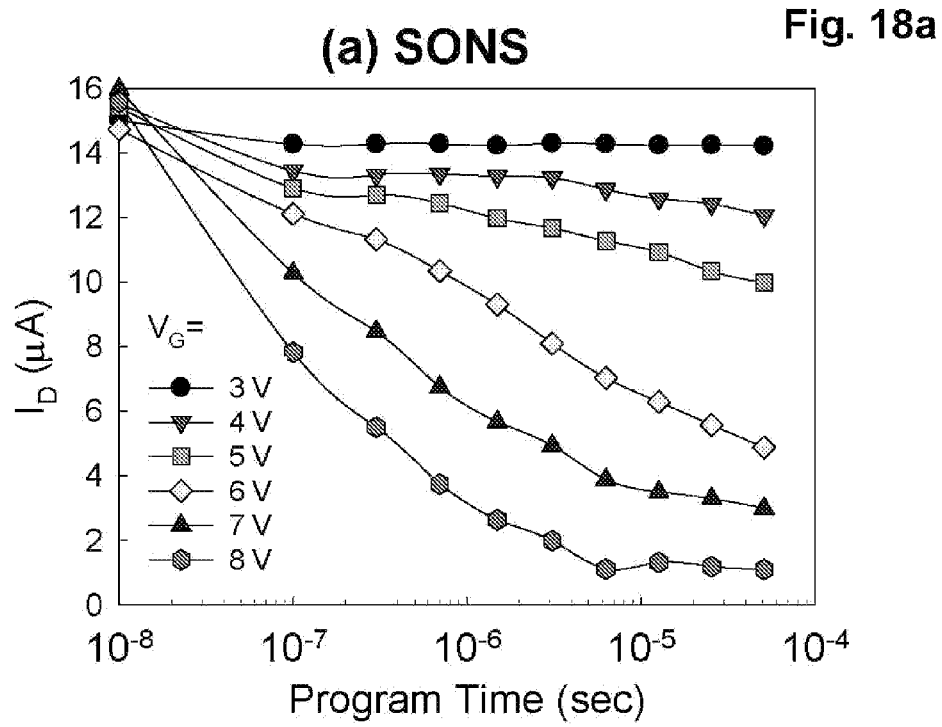
FIGS. 18a-18c show program transient curves for (a) SONS, (b) SONoS, and (c) SoNOS p-channel devices.
Figure 18B:
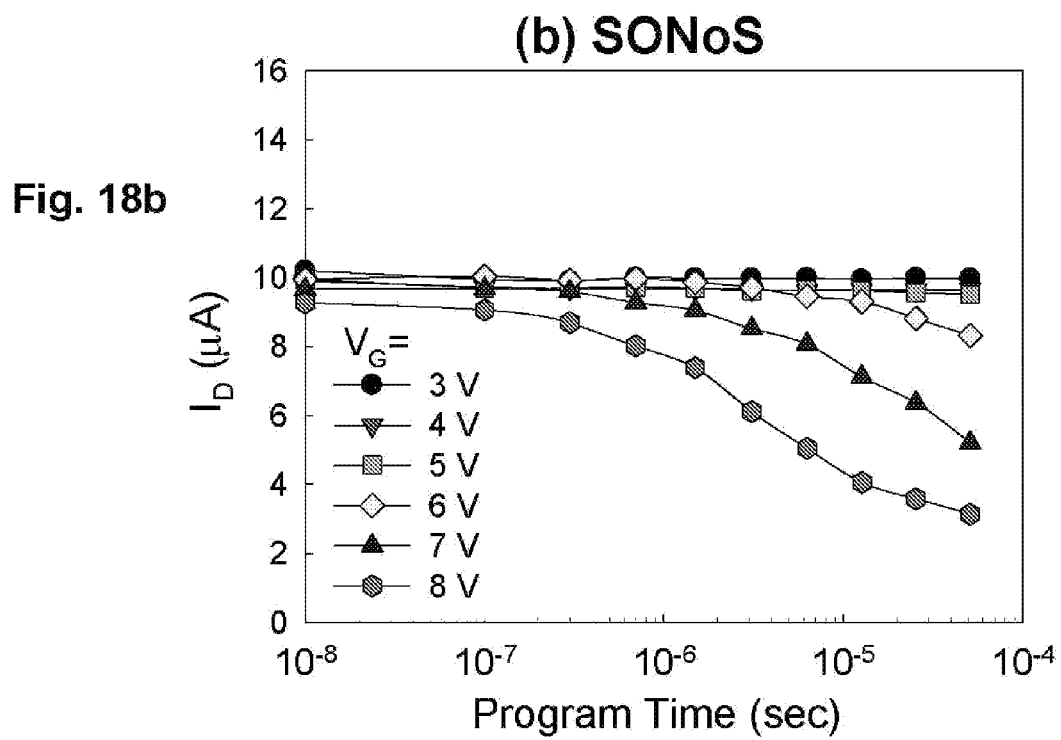
Figure 18C:
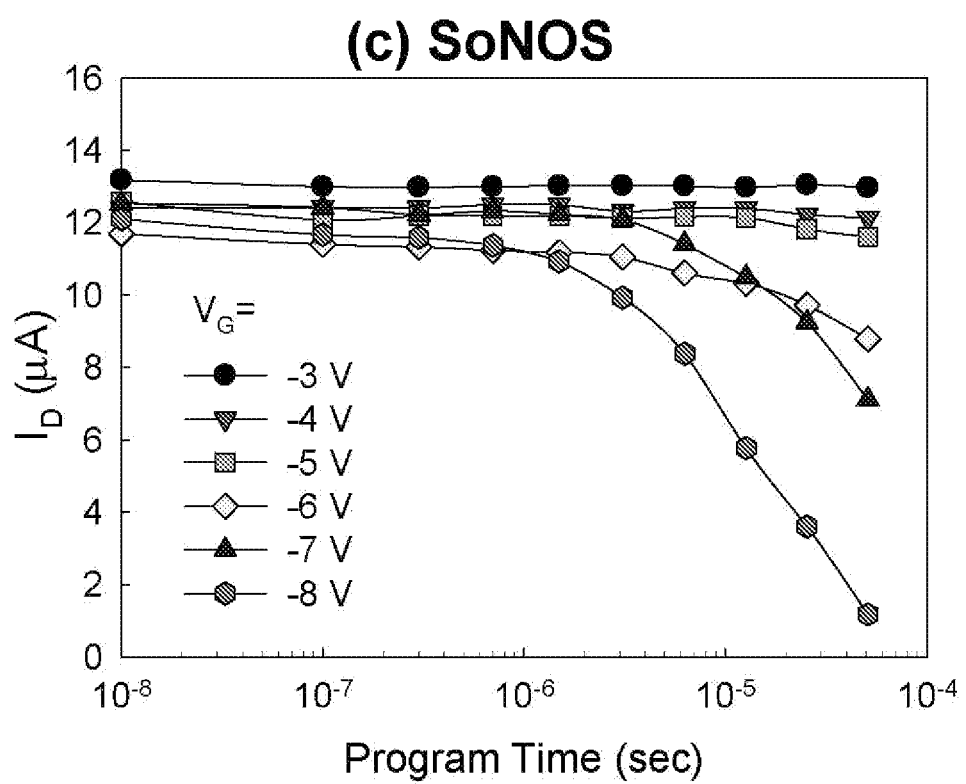

FIGS. 18a-18c illustrate program transient curves for the SONS, SONoS, and SoNOS devices of FIGS. 14a-14c. All the devices use silicon-rich nitride in the charge trapping layer. The programming injects holes and decreases the drain current. Fast programming under low voltage is achieved. The SONS cell shows the fastest program speed. SoNOS uses inverse polarity ($-V_G$) for the program, because it is channel-injection mode.

These graphs show that the devices are easily programmed within 1 µsec at low $+V_G$ bias. Moreover, SONS shows much faster speed than SONoS or SoNOS. The reason is because SONS does not have tunnel oxide, thus provides very fast speed injection (nitride has much lower barrier height than oxide). After programming, drain current decreases because of the hole injection. At longer programming time drain current approaches zero.

Figure 19A:
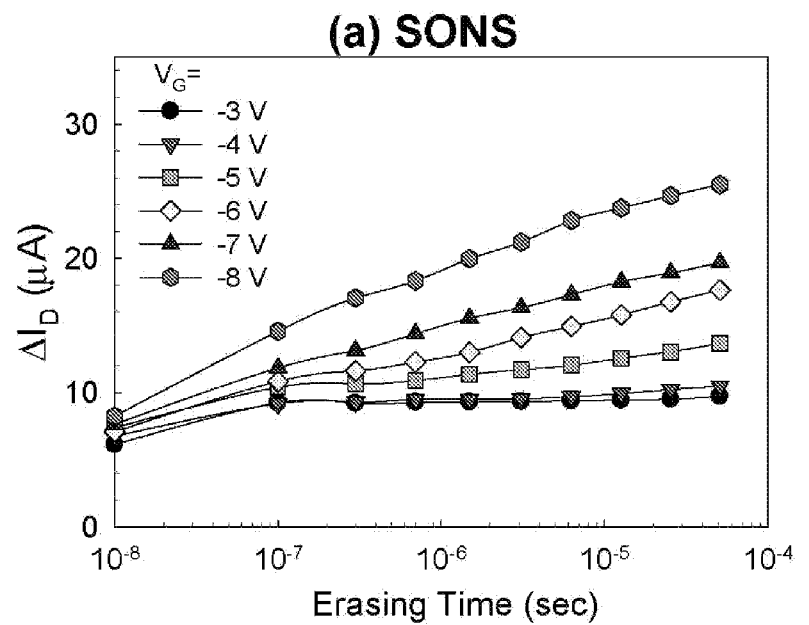
FIG. 19a-19c show erase transient curves for (a) SONS, (b) SONoS, and (c) SoNOS p-channel devices.
Figure 19B:
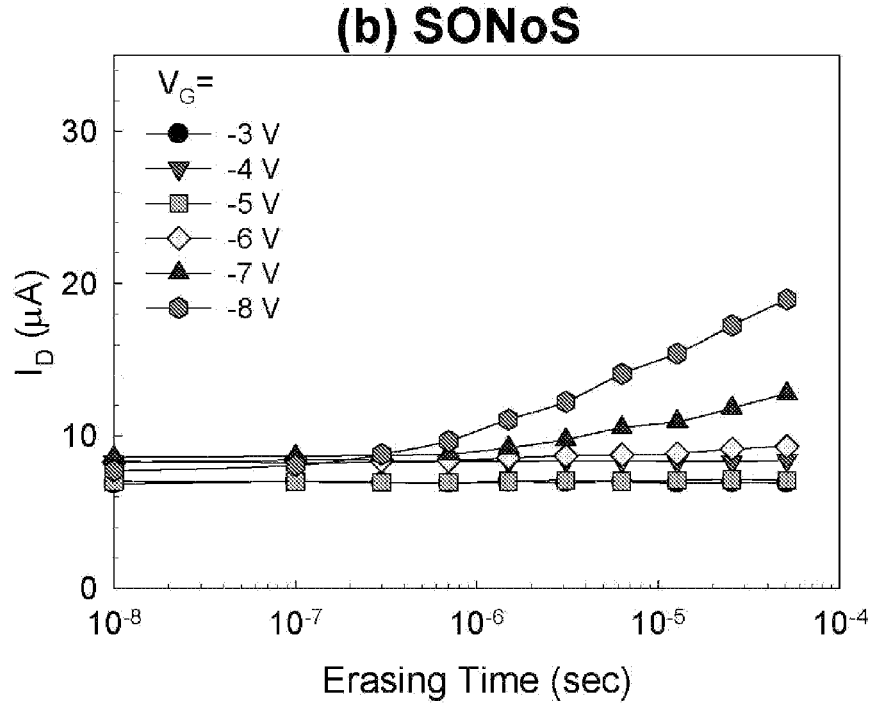
Figure 19C:
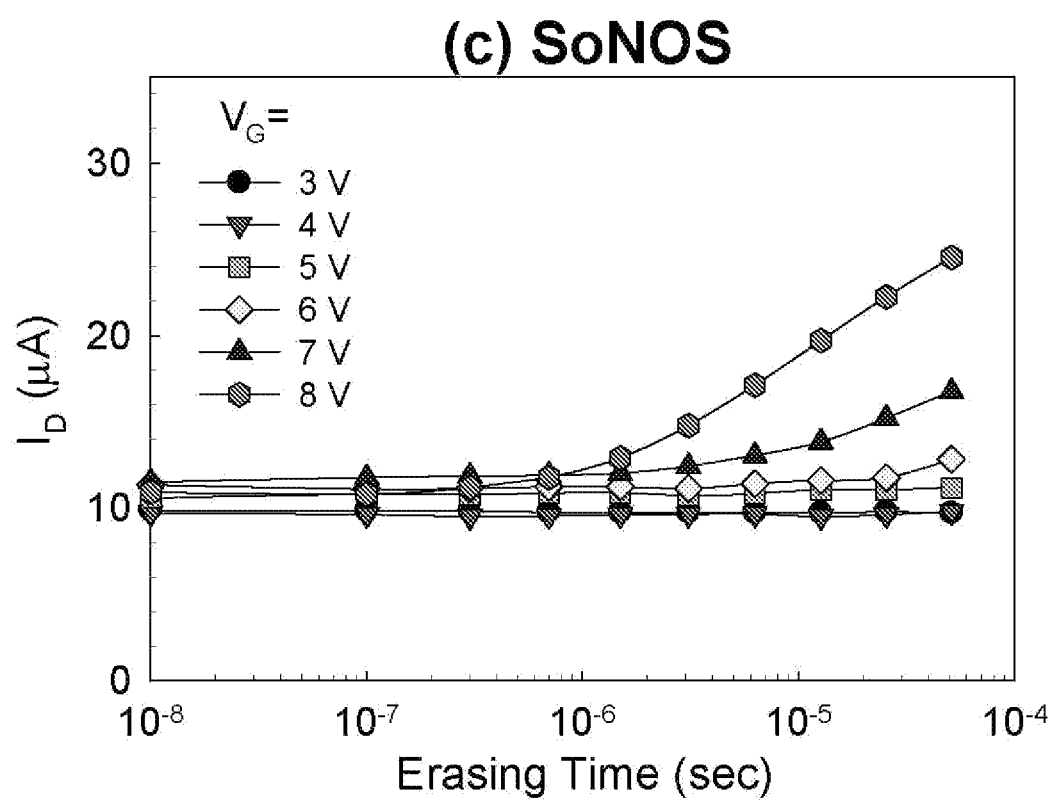

FIGS. 19a-19c show erase transient curves for (a) SONS, (b) SONoS, and (c) SoNOS p-channel devices. All the devices use silicon-rich nitride in the charge trapping layer. The erasing injects electrons and increases the drain current. Fast erasing under low voltage is achieved. SONS shows the fastest erase speed. SoNOS uses inverse polarity ($+V_G$) for the erase, because it is channel-injection mode. SONS has erasing speed comparable with programming, because nitride has similar tunneling barrier (~2 eV) for both electrons and holes.

SoNOS shows reverse polarity after program/erase, because SoNOS is programmed and erased by channel-injection, while SONS and SONoS operate through gate-injection.

Figure 20:
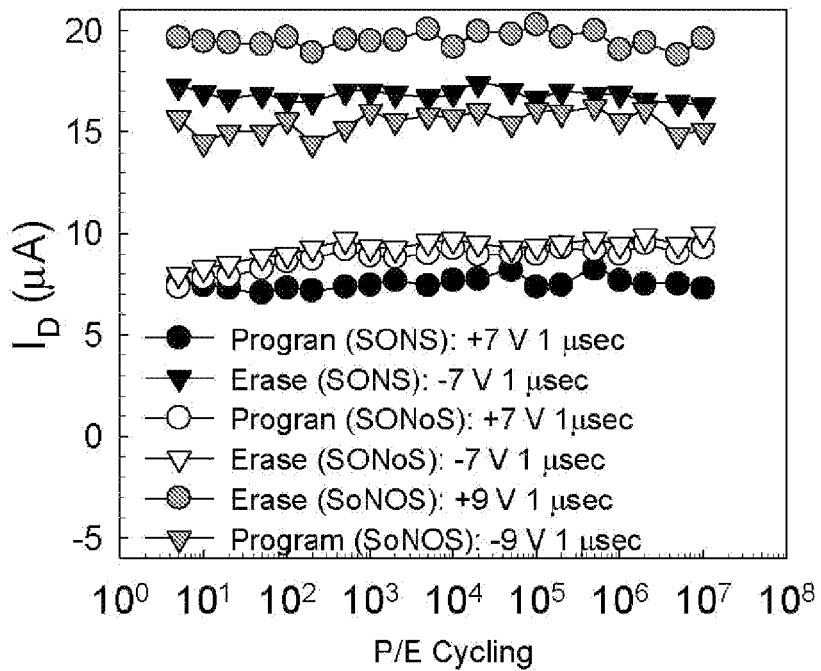
FIG. 20 is a graph showing endurance characteristics for SONS, SONoS, and SoNOS.
Figure 21:
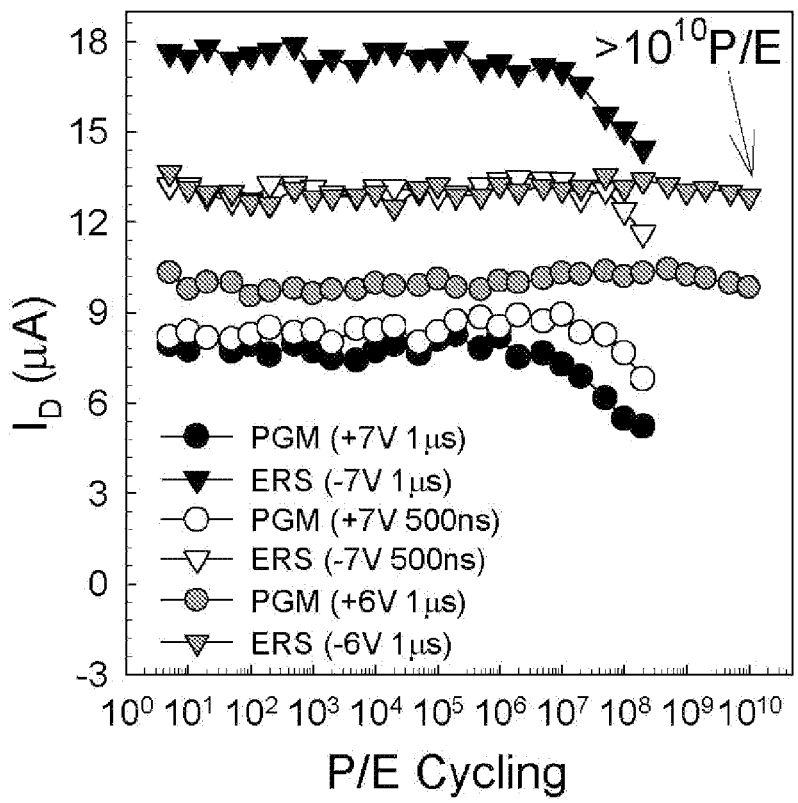
FIG. 21 is a graph showing endurance characteristics for different bias voltage and P/E time for the SONS device extended to 10G cycles.

The endurance for various devices is compared in FIG. 20, which shows a graph of program/erase cycle versus drain current. SONS shows the best memory window. This is caused by more efficient injection when the tunnel oxide is removed. Moreover, the introduction of silicon-rich nitride also enhances the charge-trapping characteristics. FIG. 21 shows a graph of program/erase cycle versus drain current for the various devices, extended to 10G cycles. The graph shows that the memory window increases with larger operation voltage. However, the endurance is degraded because the channel injection through bottom oxide also increases, leading to gate oxide degradation.

Therefore, reducing the operation voltage is necessary to improve the endurance. At $V_G$<6V, endurance can be greater than 10G cycles, suitable for high-endurance cache or DRAM applications.

Figure 22:
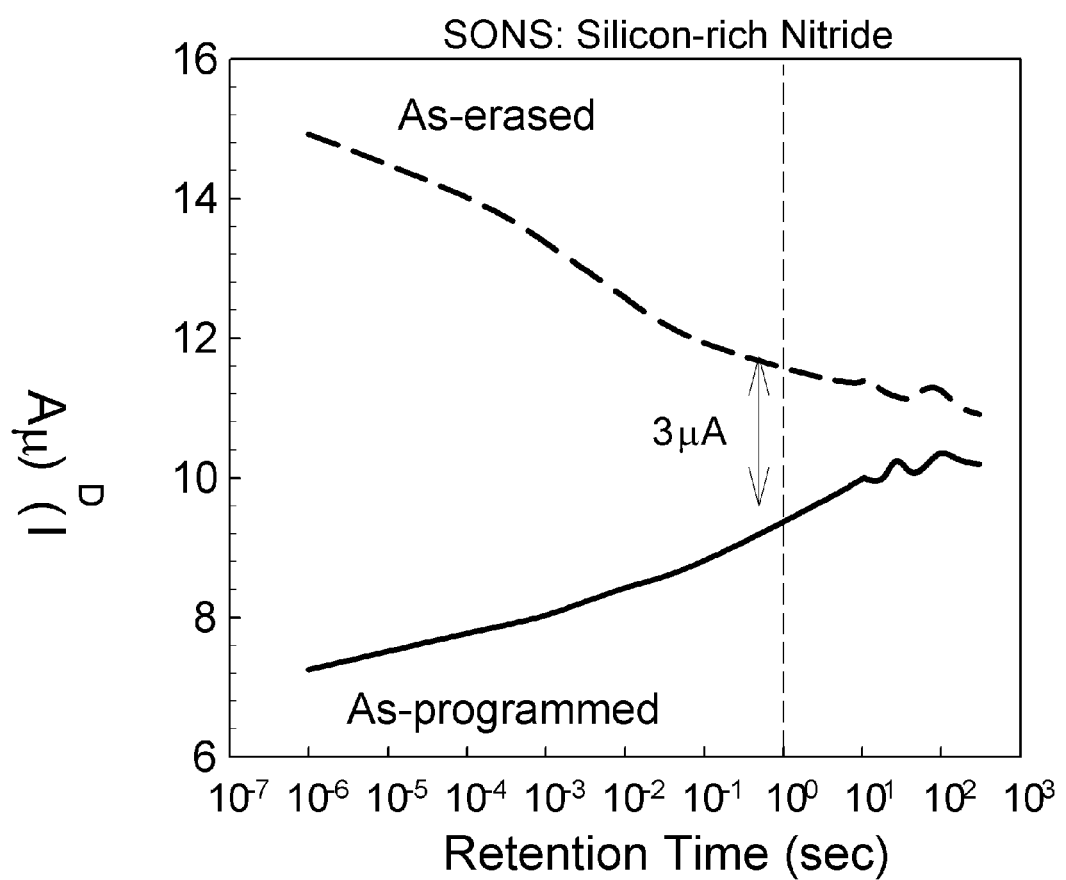
FIG. 22 is a graph showing room-temperature retention of SONS device.

The retention of the SONS device with silicon-rich nitride is characterized in FIG. 22. Charge relaxation is observed for both programmed and erase states. However, sufficient current window (~3 μA) is maintained after 1 sec, suitable for DRAM applications.

The proposed array architecture and program/erase methods are like those discussed above in connection with FIGS. 5-7. For programming, $+V_{PGM}/2$ and $-V_{PGM}/2$ are applied at the selected WL and BL, respectively. Erase uses the opposite polarity voltages and can also be randomly selected. In FIGS. 18a-c and 19a-c, $+V_{PGM}/2$ (~3 V) shows very low program/erase rate, thus allowing sufficient disturb window. Note that the direct tunneling program/erase method requires negligible current (~pA), thus allowing parallel page program (just like NAND Flash) to boost the overall program/erase throughput.

On the other hand, all the devices are parallel connected (in contrast to NAND), thus providing large read current for fast reading.

A novel 1T DRAM cell is proposed and analyzed in detail. It shows a new path to low-power and high-density DRAM applications.

Figure 23:
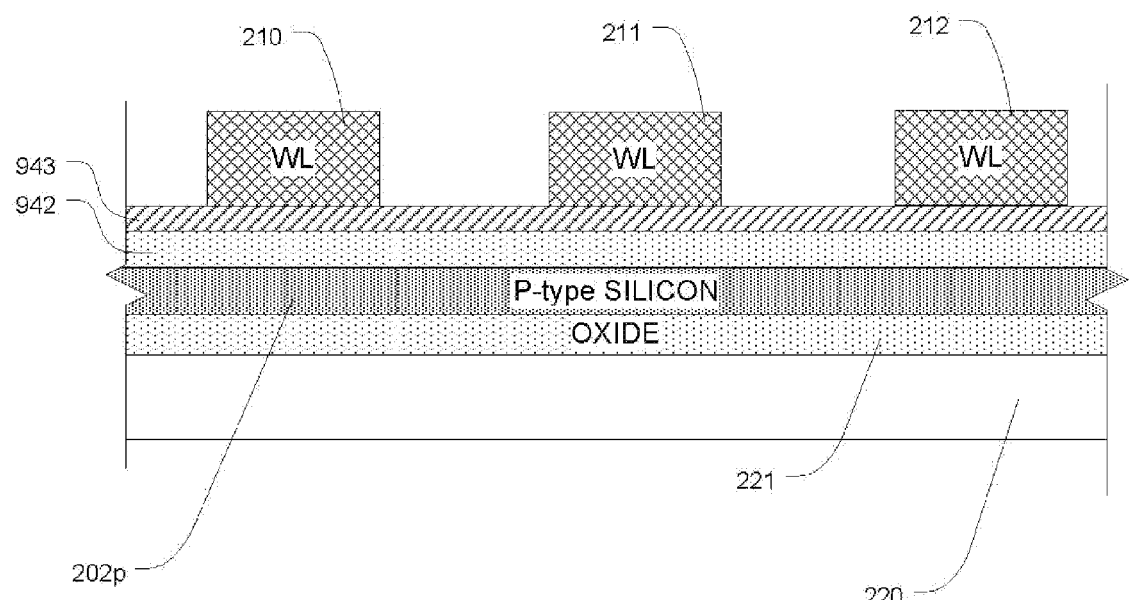
FIG. 23 is a cross-sectional view taken orthogonal to the word lines in a memory array structure like that of FIG. 10, for implementation using SONS charge trapping memory cells adapted for use in a system providing for refresh operations, such as used in dynamic random access memory devices, and adapted for gate injection hole tunneling between the word line and the charge trapping layer.

FIG. 23 illustrates an implementation like that of FIG. 10, except that the ultrathin tunneling layer between the word line 210 and the charge trapping layer 441 of FIG. 10 is removed for gate injection operation, and the body line 202p is p-type silicon for a p-channel implementation. Reference numerals used in FIG. 10 are used again in FIG. 23 for corresponding elements and not described again. The charge trapping structure in FIG. 23 includes a blocking layer 942 on the semiconductor body line 202, and a charge trapping layer 943 on the blocking layer 942. The blocking layer 942 and charge trapping layer 943 are implemented as described above. The structure of the cells in this array is also seen in FIG. 14a.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
an insulator layer over a substrate;
a plurality of semiconductor bodies on the insulator layer;
a plurality of pairs of source/drain lines on the insulator layer, wherein the pairs of semiconductor source/drain lines are separated by insulating material from other pairs in the plurality, the pairs in the plurality of pairs including a first source/drain line on one side and a second source/drain line on another side of a corresponding semiconductor body in the plurality of semiconductor bodies;
channel regions in the semiconductor bodies between corresponding pairs of source/drain lines, one of said first and second source/drain lines in each of said pairs being electrically connected at a common connection outside of the channel regions, to the corresponding semiconductor body;
a source of a bias potential connected to said common connection;
a plurality of word lines overlying the plurality of pairs of source/drain lines; and
an array of charge storage structures between the plurality of word lines and the channel regions forming memory cells, wherein the memory cells are arranged in a divided bit line architecture; and wherein the plurality of word lines are in direct contact with the array of charge storage structures,
wherein:
the insulator layer comprises a plurality of recesses extending parallel to one another in a first direction;
the source/drain lines and semiconductor bodies therebetween being structures within the recesses, having planar top surfaces, and extending in the first direction;
the charge storage structures being structures within the recesses, on the planar top surfaces of the semiconductor bodies and extending in the first direction; and
the word lines being spaced apart, parallel structures over the charge storage structures, and extending in a second direction generally perpendicular to the first direction.

2. The memory device of claim 1, wherein the plurality of semiconductor bodies comprise continuous semiconductor body line strips between corresponding pairs of semiconductor source/drain lines.

3. The memory device of claim 1, wherein the charge storage structures in the array of charge storage structures respectively comprise a tunneling layer having an effective oxide thickness of about 1.5 nm or less, a charge trapping layer and a blocking layer.

4. The memory device of claim 1, wherein the charge storage structures in the array of charge storage structures respectively comprise a tunneling layer, a dielectric charge trapping layer and a dielectric blocking layer, the tunneling layer including a first layer having a hole tunneling barrier height, a second layer having a hole tunneling barrier height less than the first layer, and a third layer having hole tunneling barrier height greater than that of the second layer.

5. The memory device of claim 1, wherein the charge storage structures overlie the source/drain lines and the channel regions in the semiconductor bodies therebetween.

6. The memory device of claim 1, wherein the plurality of word lines provide gate voltage to the array of charge storage structures.

* * * * *